(12) United States Patent
Buhler et al.

(10) Patent No.: US 7,290,336 B2
(45) Date of Patent: Nov. 6, 2007

(54) METHOD OF FABRICATING AN ARRAY OF MULTI-ELECTRODED PIEZOELECTRIC TRANSDUCERS FOR PIEZOELECTRIC DIAPHRAGM STRUCTURES

(75) Inventors: Steven A. Buhler, Sunnyvale, CA (US);
John S. Fitch, Los Altos, CA (US);
Meng H. Lean, Santa Clara, CA (US);
Karl A. Littau, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 448 days.

(21) Appl. No.: 11/104,887

(22) Filed: Apr. 13, 2005

(65) Prior Publication Data

US 2005/0200236 A1 Sep. 15, 2005

Related U.S. Application Data

(62) Division of application No. 10/739,243, filed on Dec. 18, 2003, now Pat. No. 7,176,600.

(51) Int. Cl.
*B21D 53/76* (2006.01)
*B41J 2/045* (2006.01)
*G01D 15/00* (2006.01)

(52) U.S. Cl. ............. 29/890.1; 29/25.35; 29/831; 29/832; 29/846; 29/847; 29/877; 347/68; 216/27

(58) Field of Classification Search .......... 29/25.35, 29/890.1, 832, 831, 830, 835, 846, 847, 843, 29/877; 310/311, 317, 318, 367, 357–359; 347/68–71, 72; 216/27; 451/57, 48

See application file for complete search history.

(56) References Cited

U.S. PATENT DOCUMENTS 2,953,755 A 9/1960 Mattiat (Continued)

OTHER PUBLICATIONS

Kim, Sunghwan, et al., *Piezoelectric Energy Harvesting Using a Diaphragm Structure*, SPIE's 10 Annual Symposium on Smart Structures and Materials, Mar. 2-6, 2003, San Diego, CA. (11 pages).

Kim, Sunghwan, et al., *Piezoelectric Energy Harvesting Using a Clamped Circular Plate: Experimental Verification*, ASME International Mechanical Engineering Congress and Exposition, Washington, D.C., Nov. 2003 (pp. 1-17).

(Continued)

*Primary Examiner*—Carl J. Arbes
*Assistant Examiner*—Tai Van Nguyen
(74) *Attorney, Agent, or Firm*—Fay Sharpe LLP

(57) ABSTRACT

A circuit provides energy to a plurality of piezoelectric diaphragm structures formed in a two-dimensional array. Each piezoelectric diaphragm structure includes a piezoelectric element in operational contact with at least a first side electrode and a second side electrode. A switching system includes a first connection for a first power source, for application of power to the first side electrode and a second connection for a second power source, for application of power to the second side electrode. In a first state, power appropriate for performing a poling operation of the piezoelectric material is available for application to the first electrode, and the second electrode, and in a second state, power appropriate to activate the piezoelectric material to cause operational movement of the poled piezoelectric diaphragm structure is available for application to the first electrode and the second electrode.

20 Claims, 35 Drawing Sheets

U.S. PATENT DOCUMENTS

| | | | |
|---|---|---|---|
| 3,307,052 A | | 2/1967 | Neilson et al. |
| 3,571,632 A | | 3/1971 | De Jong |
| 4,045,695 A | | 8/1977 | Itagaki et al. |
| 4,170,742 A | | 10/1979 | Itagaki et al. |
| 5,643,353 A | | 7/1997 | Wallace et al. |
| 5,663,505 A | | 9/1997 | Nakamura |
| 5,740,732 A | * | 4/1998 | Karlyn et al. ............ 101/128.4 |
| 6,091,182 A | * | 7/2000 | Takeuchi et al. ............ 310/330 |
| 6,234,608 B1 | | 5/2001 | Genovese et al. |
| 6,297,578 B1 | * | 10/2001 | Takeuchi et al. ............ 310/330 |
| 6,346,764 B1 | | 2/2002 | Boyd |
| 6,554,403 B1 | * | 4/2003 | Chen et al. .................... 347/63 |
| 6,561,625 B2 | * | 5/2003 | Maeng et al. .................. 347/47 |
| 6,597,084 B2 | | 7/2003 | Hu et al. |

OTHER PUBLICATIONS

*Fundamentals of Piezoelectricity and Piezo Actuators*, http://www.pi.ws, pp. 4-15 thru 4-17.

Sayer, M., et al., *91-310: Poling of Piezoelectric Ceramics*, Journal of the Canadian Ceramic Society, vol. 50, 1981 (9 pages).

*Introduction to Piezo Transducers*, Piezo Systems, Inc., http://www.piezo.com/bendedu.html, Jul. 11, 2003, pp. 1-7.

Torah, R.N., et al., *Experimental Analysis of the Substrate Clamping Effects on the Piezoelectric Behaviour of Thick-Film PZT Elements* (7 pages).

* cited by examiner

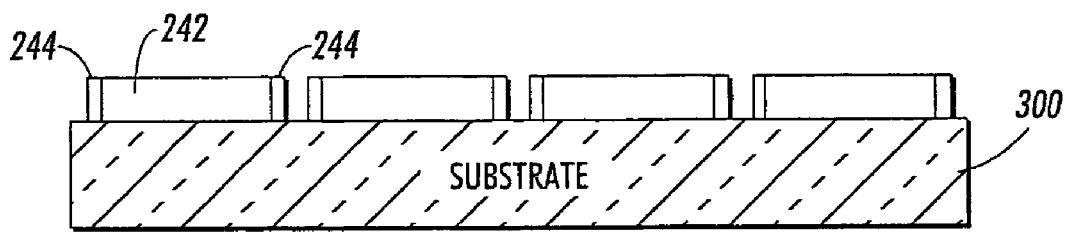
FIG. 34
FIG. 35A
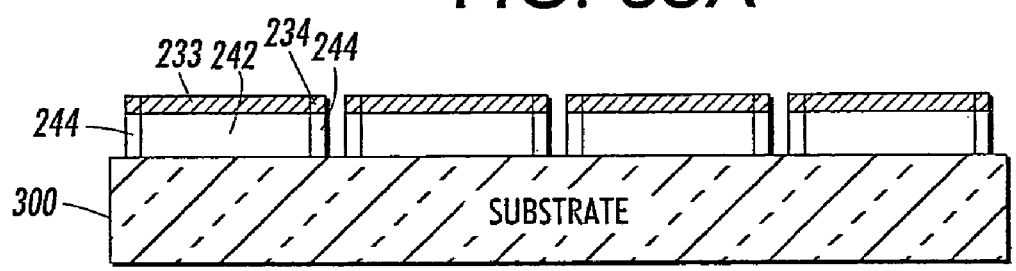
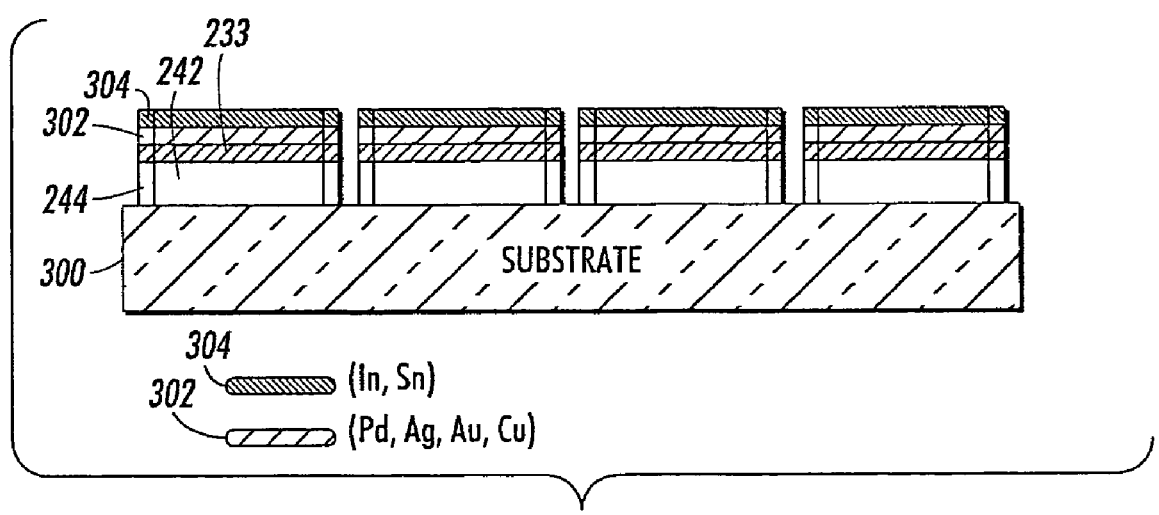
FIG. 35B

METHOD OF FABRICATING AN ARRAY OF MULTI-ELECTRODED PIEZOELECTRIC TRANSDUCERS FOR PIEZOELECTRIC DIAPHRAGM STRUCTURES

This is a divisional of U.S. patent application Ser. No. 10/739,243, filed Dec. 18, 2003, now U.S. Pat. No. 7,176, 600 entitled "POLING SYSTEM FOR PIEZOELECTRIC DIAPHRAGM STRUCTURES."

BACKGROUND

The present application is directed to piezoelectric diaphragm structures, and more particularly to poling systems for poling piezoelectric diaphragm structures for optimized diaphragm displacement.

Piezoelectric diaphragm structures are implemented as actuators which move upon being supplied with electrical energy, and as sensors (e.g., pressure, movement, strain sensors) where diaphragm movement is translated into electrical signals. One particular implementation of a diaphragm structure is as part of an ejection unit used to eject drops such as ink, biofluid or other material from a fluid reservoir.

In configuring a piezoelectric diaphragm structure, the ferroelectric ceramics are poled in order to exhibit the piezoelectric characteristics required for operation. Prior to a poling operation, domains of the materials are randomly oriented. During poling, an intense electric field is applied, which may vary dependant on the implementation, but may be in a range of 200 to greater than 15,000 V per millimeter and preferably 1,000 V to 15,000 V. When the field is removed, electric dipoles of the material stay roughly but not completely in alignment. This operation provides the material with a residual polarization.

Presently, such poling operations may occur during fabrication of piezoelectric diaphragm structures. In one operation, the piezoelectric material is poled with an external circuit which is temporarily attached during the manufacturing process. Therefore, the poling operation occurs once, and only during the manufacturing process.

A drawback to this accepted procedure is that over time a piezoelectric material will degrade. This may occur when operation of the piezoelectric diaphragm structures exceed the mechanical, thermal and/or electrical limits of the material, as well as through natural aging. This degrading of the material is particularly acute when highly responsive piezoelectric materials are used. Such highly responsive piezoelectric materials are known to improve the amount of displacement which may be obtained by a diaphragm structure. However, high response materials will also tend to degrade quicker than other piezoelectric materials. In consideration of the above, it is appreciated that once a diaphragm structure is incorporated into a larger device, such as a drop ejection unit, overtime the operational capabilities of the larger devices may degrade due to the decrease or loss in the poling directionality of the piezoelectric material.

The present state of the art does not address this potential degradation of the diaphragm structure in devices that are operating on site in an environment such as an office building, home, factory or other end user's location.

SUMMARY

A circuit provides energy to a plurality of piezoelectric diaphragm structures formed in a two-dimensional array. Each piezoelectric diaphragm structure includes a piezoelectric element in operational contact with at least a first side electrode and a second side electrode. A switching system includes a first connection for a first power source, for application of power to the first side electrode and a second connection for a second power source, for application of power to the second side electrode. In a first state, power appropriate for performing a poling operation of the piezoelectric material is available for application to the first electrode, and the second electrode, and in a second state, power appropriate to activate the piezoelectric material to cause operational movement of the poled piezoelectric diaphragm structure is available for application to the first electrode and the second electrode.

BRIEF DESCRIPTION OF THE DRAWINGS

FIG. 34 illustrates a piezoelectric element array on a top surface of a carrier substrate;

FIGS. 35A and 35B show alternative embodiments of a piezoelectric element array deposited with electrodes and other thin film metals for bonding, the piezoelectric element array is on a top surface of a carrier substrate;

DETAILED DESCRIPTION

The following description primarily emphasizes the use of a diaphragm structure as an actuator, wherein electric signals are provided to the diaphragm structure, causing movement. It is to be appreciated, however, the descriptions set forth herein are equally applicable to the use of a diaphragm structure as a sensor. In this design the diaphragm structure is used to generate output signals whereby the pressure or other physical environmental actions imposed on the diaphragm structure are sensed and delivered to an external source.

Figure 1:
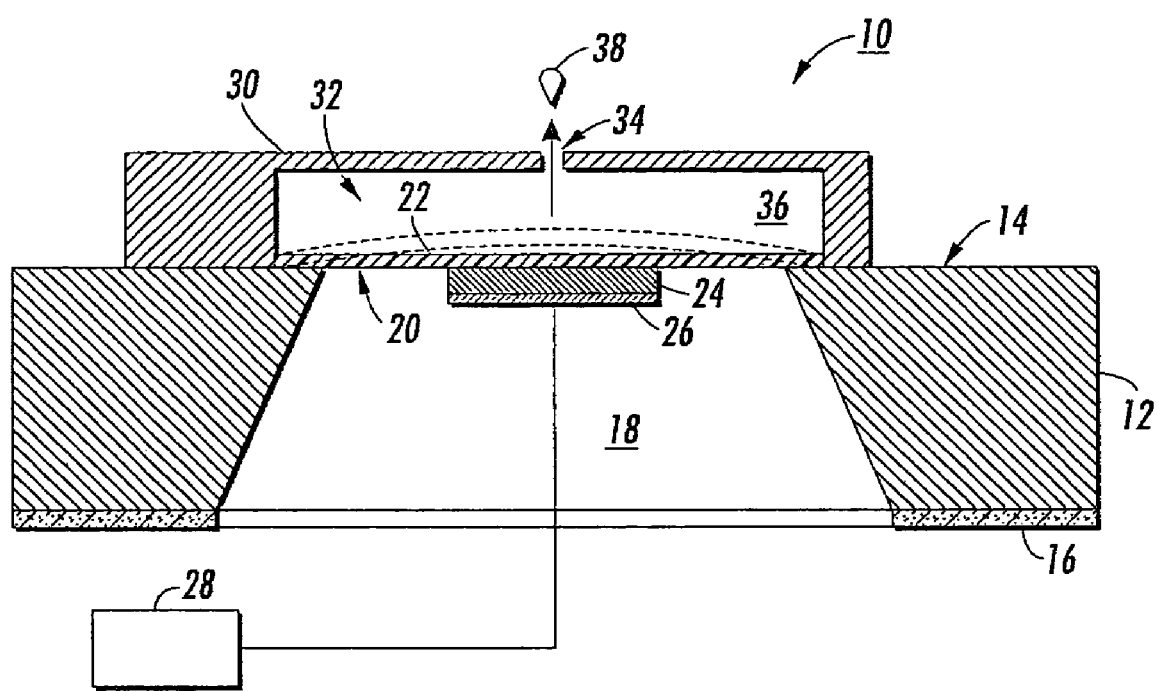
FIG. 1 is a conceptual drawing showing a piezoelectric ejection unit which may implement a diaphragm structure of the present application.

FIG. 1 illustrates a conceptual drawing showing a piezoelectric ejection device 10, which includes a plate 12 having two parallel surfaces 14, 16. The plate may be made from a metal, and anisotropically etched or otherwise manufactured to provide a recess 18 therein. Alternatively, plate 12 may be a silicon, glass or ceramic laminate where recess 18 is provided by an appropriate process, including, for example, by etching, molding or laser ablation. The recess 18 has a bottom surface 20 which is substantially parallel to plate surface 14, in order to form a relatively thin membrane for use as a diaphragm 22. Alternatively, the diaphragm may be a separate plate which is laminated or attached to the plate 12 after recess 18 is formed.

The recess bottom surface and thus the surface area of the diaphragm is predetermined to permit the appropriate deformation. Bottom surface 20 has a piezoelectric material 24 built, deposited or otherwise attached. An electrode 26 is positioned on a surface of the piezoelectric material 24, and is connected to a source of energy 28 such as a power supply. A nozzle plate 30 is formed on plate surface 14 and has an internal cavity 32, open against the plate surface and aligned with the diaphragm 22, to act as a fluid reservoir. The nozzle plate 30 has a nozzle 34 which may be centrally aligned with the diaphragm 22 or may be offset as appropriate. Cavity 32 is filled with fluid 36 through an inlet (not shown).

Actuation of energy source 28, causes energy, such as in the form of voltage, to be applied to piezoelectric material 24 via electrode 26, which in turn deforms the diaphragm 22 in the upward direction towards nozzle 34, as shown in dashed line. This action increases the pressure on fluid 36 in cavity 32, initiating the ejection process. A droplet 38 is ejected from nozzle 34 as diaphragm 22 moves upward. The diaphragm then moves in a direction away from the nozzle, as when voltage is removed from electrode 26.

Turning to FIGS. 2A-4B, illustrated are three circular piezoelectric disc diaphragm structures in accordance with the present application. It is to be understood that the diaphragm structures in this and other embodiments, are described with particular reference to a substantially circular design. However, such a description is only intended for ease of explanation and is not intended to limit the embodiments to circular designs. Rather, the disclosed concepts are equally applicable to other geometric shapes, such as but not limited to rectangular, diamond, rhombus. In these instances, the structures would therefore have a central region (i.e., equating to a disc) or an outer edge region (i.e., equating to an annulus).

Figure 2A:
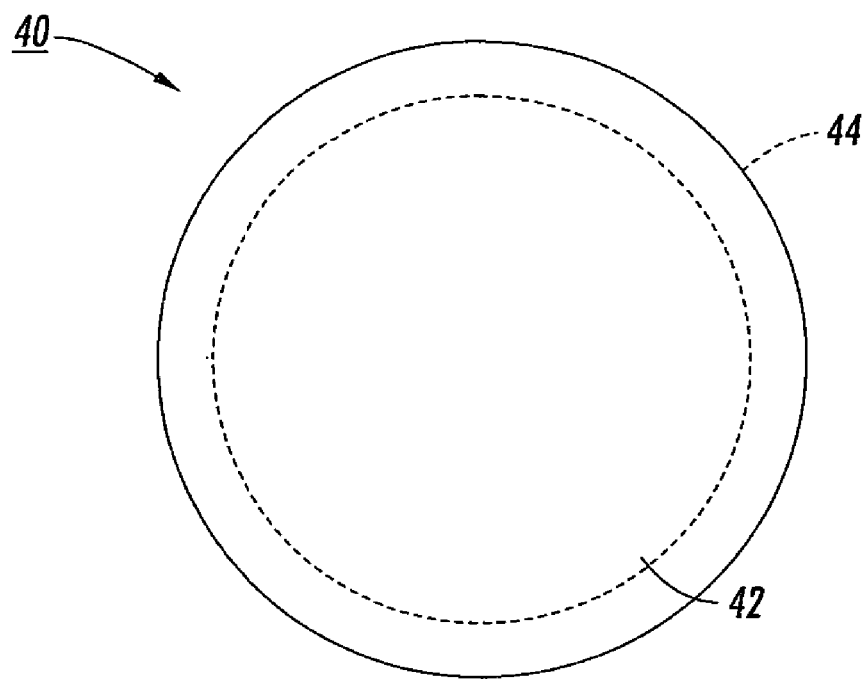
FIGS. 2A and 2B, respectively, illustrate a disc diaphragm structure in accordance with the present application.
Figure 2B:
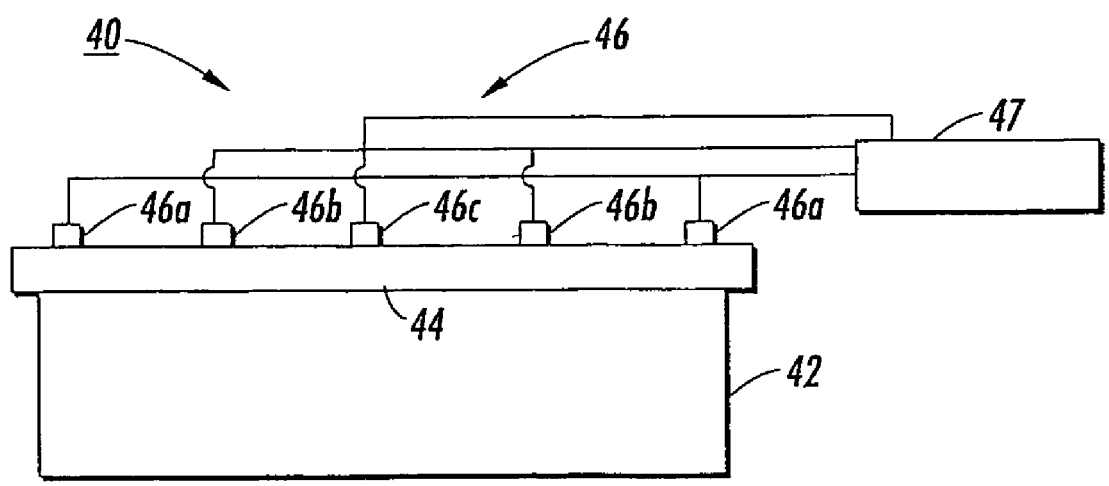

FIGS. 2A and 2B, are top and side views of a disc piezoelectric diaphragm structure 40, which includes a diaphragm 42 having an appropriate stiffness for an intended use, such as but not limited to stainless steel.

Diaphragm 42 is covered by a piezoelectric disc 44. As shown in FIGS. 2A and 2B, the piezoelectric disc 44 may overlap diaphragm 42. While not illustrated in this figure, diaphragm 42 may be part of a larger structure, such as plate 12 of FIG. 1. Therefore, the overlapping piezoelectric disc 44 would cover a portion of such a plate, clamp or anchor-type structure. As shown more clearly in FIG. 2B, piezoelectric disc 44 has attached to a first or top surface an electrode arrangement, such as an inter-digitated electrode grid 46, comprised of a plurality of electrodes 46a-46c.

Although not shown in this figure, disc diaphragm structure 40 may also include either a single electrode or multiple electrodes on a second or bottom surface of piezoelectric disc 44. In one implementation, block 47 is a power supply which drives electrodes 46a-46c, causing a deformation of piezoelectric disc 44, which in turn causes movement of diaphragm 42. In this implementation, the disc diaphragm structure 40 is used as an actuator. In an alternative implementation, disc diaphragm structure 40 may be designed as a sensor, where physical movement of diaphragm 42 causes movement of piezoelectric disc 44, which in turn generates electrical signals. In this embodiment, block 47 is a device which receives the electrical signals from electrodes 46a-46c.

Figure 3A:
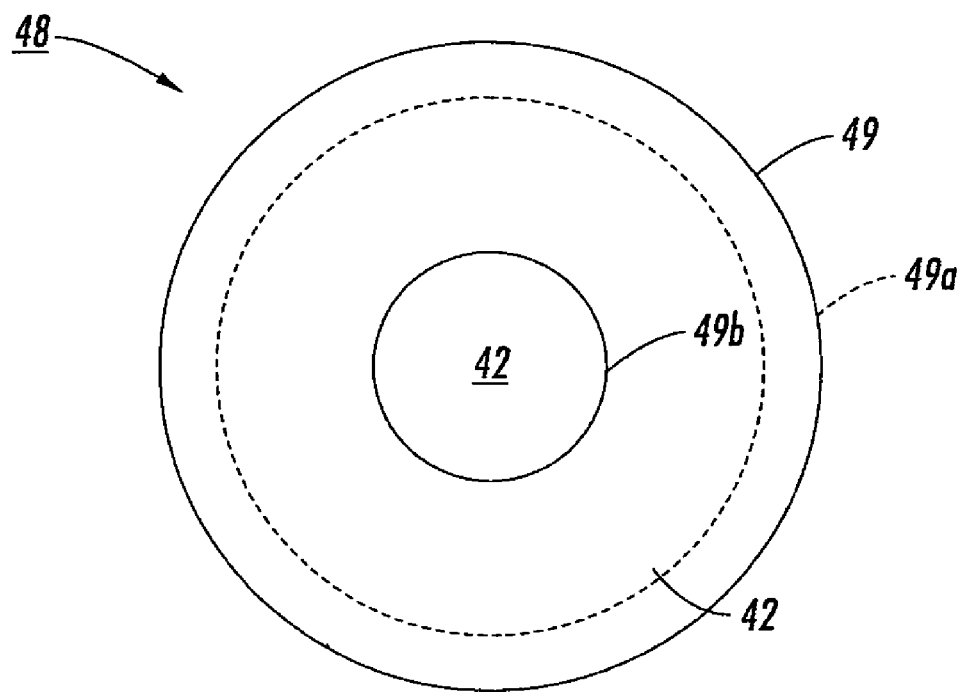
FIGS. 3A and 3B illustrate an annular ring diaphragm structure in accordance with the present application.
Figure 3B:
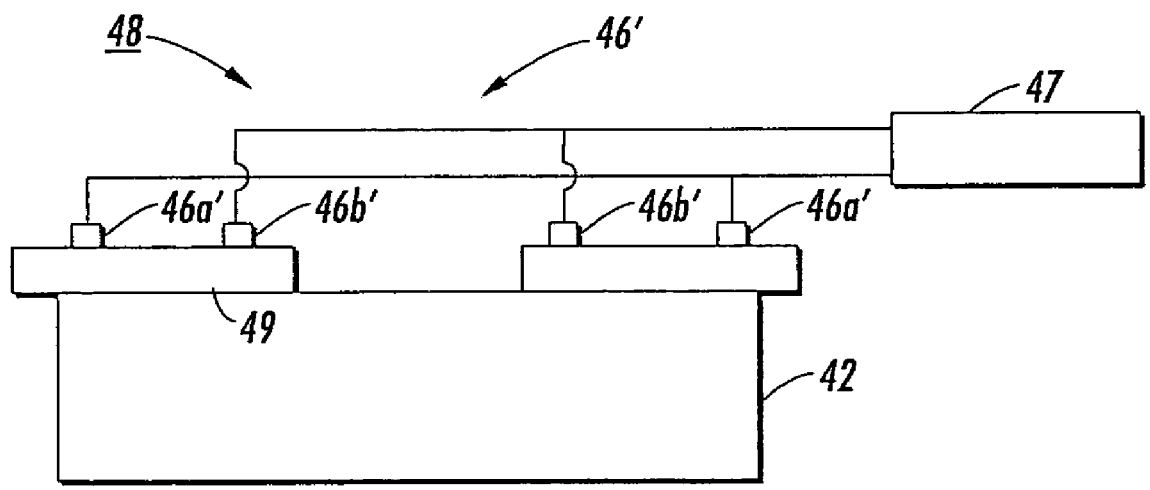

Turning to FIGS. 3A and 3B, illustrated is an piezoelectric annular diaphragm structure 48 in accordance with a second embodiment of the present application. In this design, diaphragm 42 is covered by a piezoelectric annular ring 49, having an outer radius 49a, and an inner radius 49b. The inner radius 49b is a distance from the center of the diaphragm 42, whereby an inner area of diaphragm 42 is not covered by the piezoelectric annular ring 49.

As shown in FIG. 3B, a plurality of electrodes 46a', 46b' of an electrode arrangement, such as an inter-digitated electrode grid 46' are on a first or upper surface of annular ring 49. Since there is no piezoelectric material at the inner area of diaphragm 42, electrode 46c of FIG. 2B is not used. Also, similar to FIG. 2B, this device may be operated either as an actuator, or a sensor, similar to that described above.

Figure 4A:
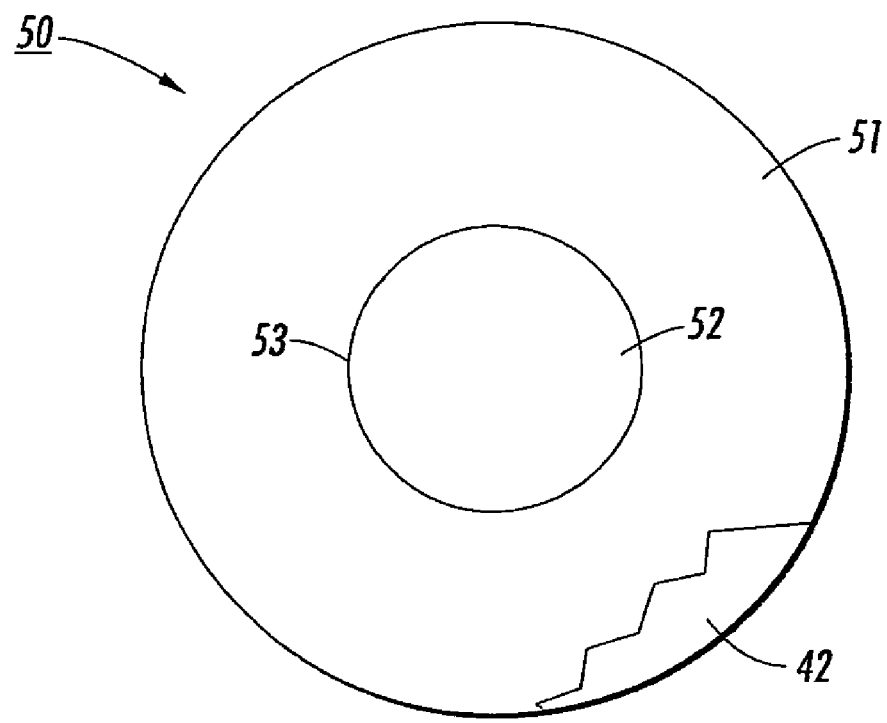
FIGS. 4A and 4B illustrate a two-region diaphragm structure in accordance with the present application.
Figure 4B:
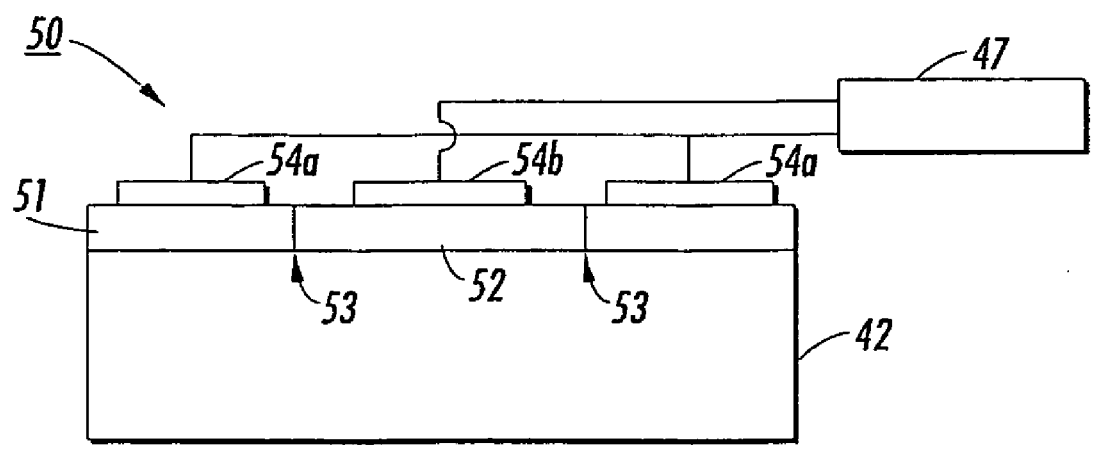

Turning to FIGS. 4A and 4B, set forth is a piezoelectric two-region diaphragm structure 50 in accordance with a third embodiment of the present application. Two-region diaphragm structure 50, includes a piezoelectric annular ring region 51 and a piezoelectric disc region 52 separated by boundary 53. These regions are concentric and are attached to diaphragm 42, which, similar to the previous embodiment, may be made of any material having appropriate stiffness for an intended use, such as but not limited to stainless steel, similar to FIGS. 2A-3B.

An upper surface of annular ring region 51 carries a first electrode 54a, and upper surface of disc region 52 carries a second electrode 54b, which form an electrode arrangement. Similar to FIGS. 2B and 3B, block 47 may represent a power source or a signal receiving device, dependant upon whether the two-region diaphragm structure 50 is operational as an actuator or sensor.

Figure 5A:
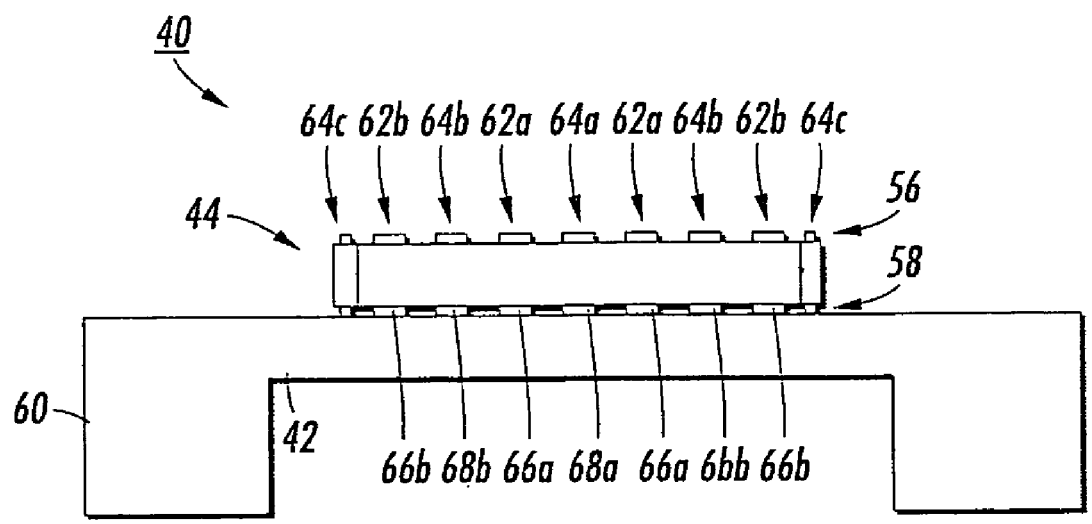
FIGS. 5A and 5B, respectively, show a partial cross-sectional view and a partial top view of the annular ring diaphragm structure.
Figure 5B:
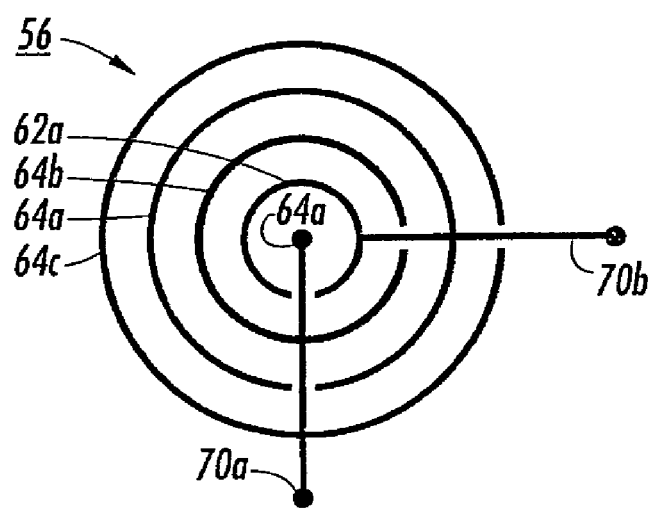

Turning to the partial cross-sectional view of FIG. 5A and partial top view of FIG. 5B, a more detailed discussion is provided for circular piezoelectric disc 44, of disc diaphragm structure 40, which carries a first inter-digitated electrode (IDE) grid 56 on a first or top surface, and an optional second inter-digitated electrode (IDE) grid 58 on a second or bottom surface. The numbering of electrodes of FIG. 2B (i.e., 46a-46c) is replaced in the present discussion with new numbering for convenience of explanation. Diaphragm 42, on which piezoelectric disc 44 is located, is part of a larger component such as plate 12 of FIG. 1, or other appropriate design. In this arrangement diaphragm 42 is held by clamp or anchor section 60. Diaphragm 42 and clamp or anchor section 60 may be formed as a single integrated body, or these sections may be individual components fastened together by known techniques. Piezoelectric disc 44 may overlap diaphragm 42 and extend onto the anchor 60.

Inter-digitated electrode (IDE) 56, includes a plurality of electrodes 62a-62b, and electrodes 64a-64c. Electrodes 62a-62b and 64a-64c are circular in construction, to correspond with the circular piezoelectric material. In practice, electrodes 62a-62b have applied voltages of an opposite sign of electrode 64a-64c. In an alternative design, optional IDE 58 may be replaced with a single electrode.

FIG. 5B, which is a top view of IDE 56, also shows electrical conductors 70a, 70b used to provide energy to electrodes 62a-62b and 64a-64c. Electrodes 64a-64c are connected to a first conductor 70a. The supplied electrodes 62a-62b are shown with gaps not touching conductor 70a. A similar design is used in connection with second conductor 70b. Conductors 70a and 70b may be provided in the Z-axis perpendicular to the electrodes.

Figure 6A:
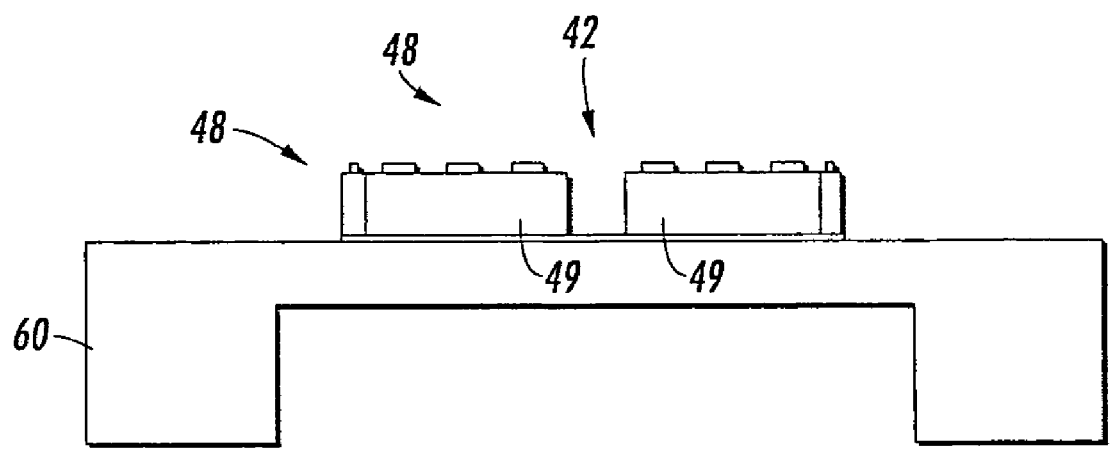
FIGS. 6A and 6B are, respectively, partial cross-sectional and partial top views of an annular ring diaphragm structure without center electrodes.
Figure 6B:
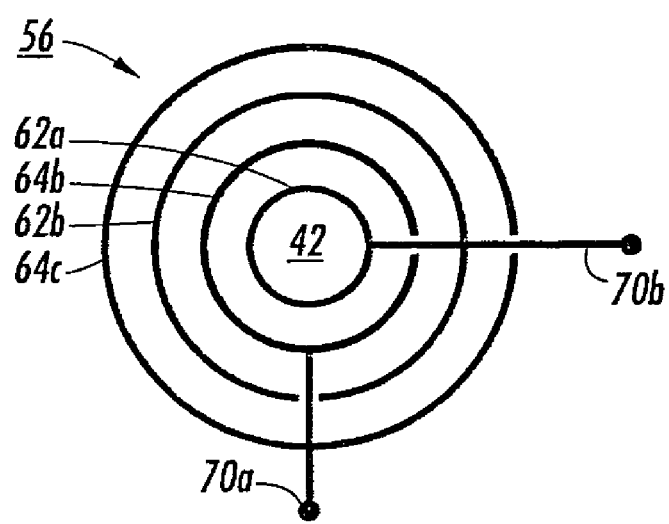

FIGS. 6A and 6B, are partial cross-sectional and top views of annular ring diaphragm structure 48. In this design, since the center of diaphragm 42 is not covered with piezoelectric material, middle electrode 64a is not used. The remaining electrodes and other numbered elements are the same as shown in FIGS. 5A and 5B. As will be expanded on in following sections, removal of the center portion of the piezoelectric material will, in some driving arrangements, permit increased movement of the piezoelectric annular ring 49, resulting in greater diaphragm deflection.

Figure 7A:
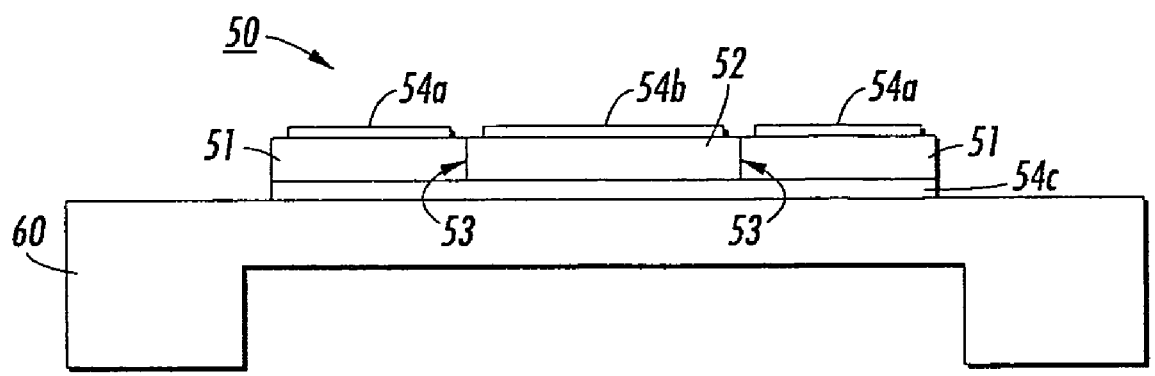
FIGS. 7A and 7B are, respectively, partial cross-sectional and top views of a two-region diaphragm structure.
Figure 7B:
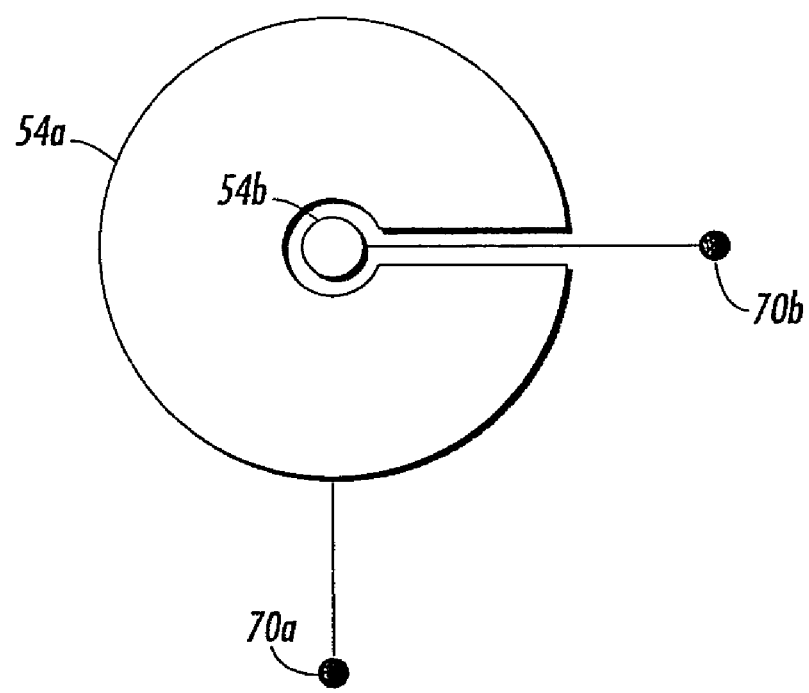

FIGS. 7A and 7B are partial cross-sectional and top views of two-region diaphragm structure 50. In addition to electrode 54a on a top surface of annular ring 51, and electrode 54b on a top surface of disc 52, an electrode 54c may be located on a bottom surface across both the annular ring region 51 and disc region 52. FIG. 7B shows the annular ring electrode 54a connected to conductor 70a, and disc electrode 54b connected to conductor 70b. These conductors are provided to a power source configuration (not shown) which drives the independent electrodes. In this embodiment, the entire diaphragm is covered with piezoelectric material, therefore, the stiffness of the diaphragm is maintained to a greater degree than diaphragm structures presently available, which tend to locate the edge of the piezoelectric material close to the edge of the active diaphragm, or somewhat interior. Those existing designs cause the stiffness of the diaphragm to be reduced at the edge of the active region, which affects the overall diaphragm stiffness. In FIGS. 5A, 6A and 7A the piezoelectric material 44 may extend beyond the diaphragm 42, thus further increasing the stiffness. The increased stiffness afforded by the diaphragm structures in these figures improve performance in fluid-ejecting applications, as the resonance frequencies will be maintained at a higher level.

Figure 8A:
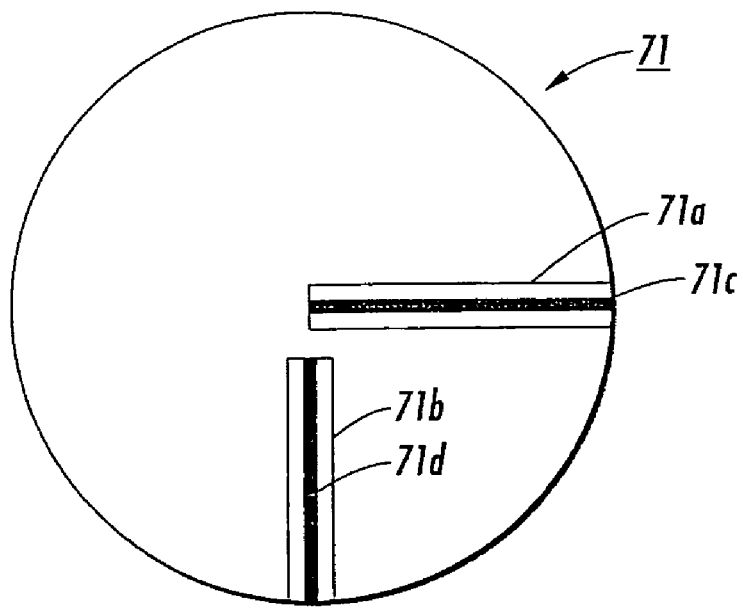
FIGS. 8A and 8B illustrate an oxide mesa design which may be used to connect to electrodes of each of the diaphragm structure embodiments.
Figure 8B:
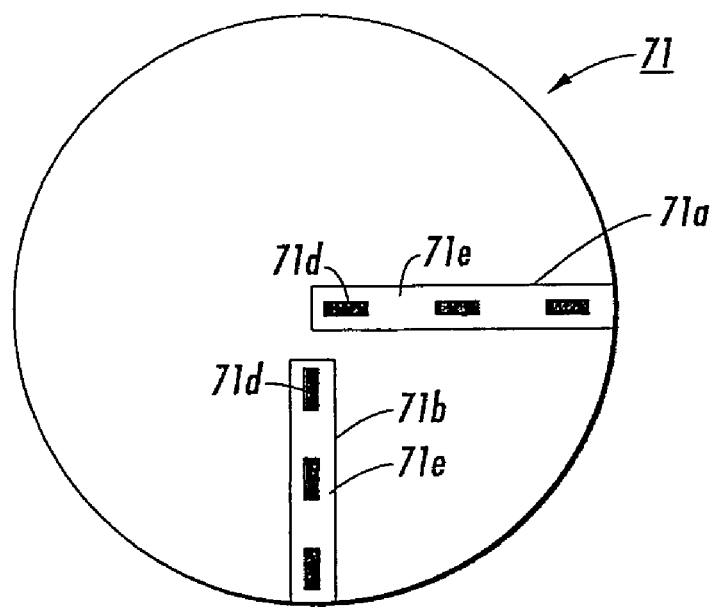

As previously mentioned, each of the foregoing embodiments may have conductors 70a and 70b provided in the Z-axis perpendicular to the electrodes. It is to be appreciated, however, that other connection schemes may be used. One such alternative is, for example, shown by FIGS. 8A and 8B. This design employs an oxide mesa 71 to which the electrodes of piezoelectric material are attached. Grooves 71a, 71b are formed in mesa 71 from approximately an area corresponding to the center of the mesa to the edge of the mesa. Metal lines 71c and 71d are patterned or deposited within grooves 71a, 71b, providing external connections. The metal lines 71c, 71d in the grooves are selectively covered by an overcoat oxide 71e, such that metal which corresponds to electrodes, remains exposed. Then when placed into contact with the diaphragm structures (e.g., 40, 48, 50) appropriate connections to the electrodes are made. A similar connection to electrode 54c of FIG. 7A or array 58 of FIG. 5A may also be made.

Turning to the manufacture of the piezoelectric diaphragm structures, a stage of manufacture includes poling of the piezoelectric material. Due to the anisotropic nature of piezoelectric material, effects are dependant upon direction.

Figure 9A:
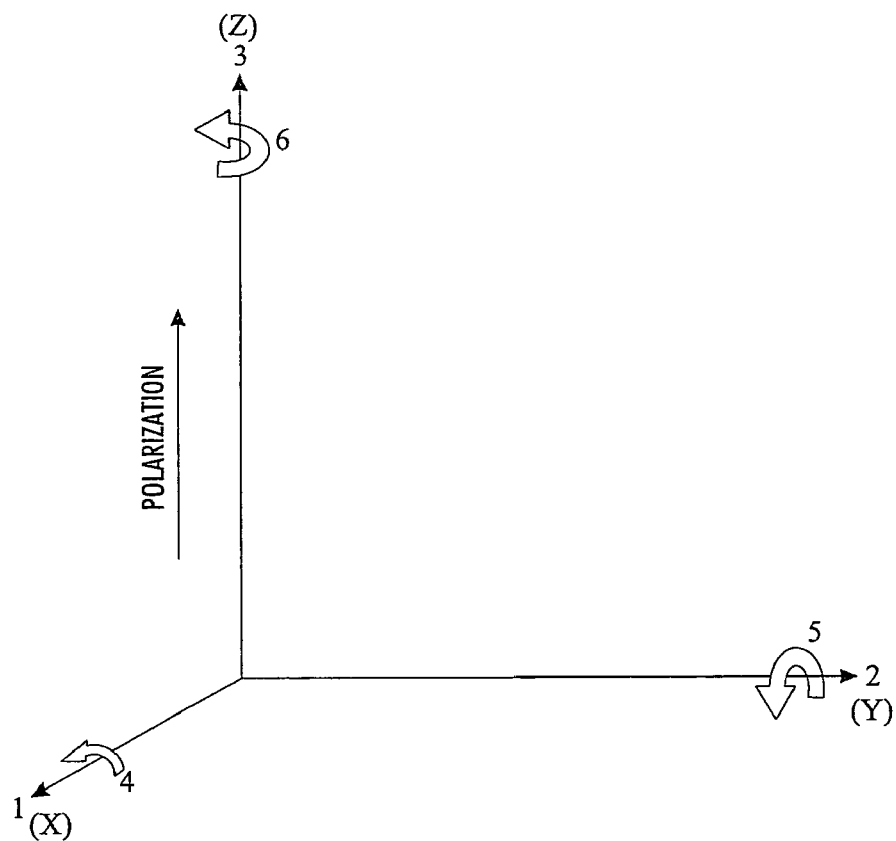
FIG. 9A identifies directions of the axes of poling directions in a conventional co-ordinate system.
Figure 9B:
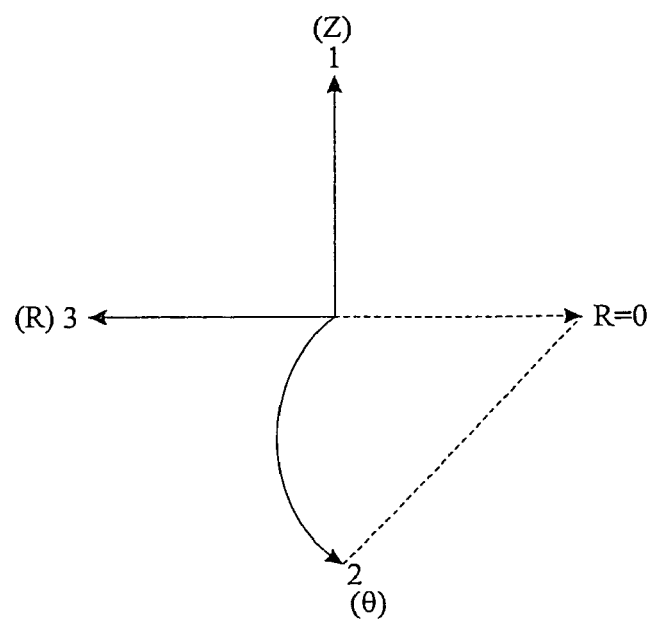
FIG. 9B identifies directions of the axes of poling directions in a cylindrical coordinate system.

Therefore, as depicted in FIG. 9A, to identify directions in one design, the axes or directions, termed 1, 2 and 3, are introduced, analogous to X, Y and Z of the classical right-hand orthogonal coordinate system. The axes 4, 5 and 6 identify rotations (i.e., shear). In another design, and as will be explained in more detail below, the convention of direction described in FIG. 9A is altered or rotated to a position such as shown in FIG. 9B. In this coordinate system, the reference directions are provided in what may be considered a cylindrical coordinate system, where direction 1 is in the Z-axis, direction 3 is now in a radial in-plane direction, and direction 2 is designated as a θ position, representing the cylindrical aspect of the coordinate system. FIG. 9B is intended to emphasize an alternative polarization mode which will be expanded on below.

The poling process uses relatively high voltages to obtain the required applied field, creating the possibility of dielectric breakdown under the high applied field. Therefore, an objective of the poling process is to provide a maximum amount of reorientation of the piezoelectric domains using the lowest applied field in the shortest possible time. A number of poling techniques, including DC poling, DC plus AC poling, as well as pulse or switched DC poling, have been described, and any of these or other appropriate poling techniques may be used. These poling techniques may be implemented with elevated temperatures to facilitate the poling operations.

Once the piezoelectric material has been poled, application of an electric field (E-field) will displace the piezoelectric. This displacement of the poled piezoelectric is primarily a function of the applied electric field strength (E), the piezoelectric used, and the length (L) of the piezoelectric. The material properties can be described by the piezoelectric strain coefficients $d_{ij}$, which describe the relationship between the applied electrical field and the mechanical strain produced.

The most common mode of operation is a $d_{31}$ mode which applies when polarization of the piezoelectric is in direction 3 of the classic orthogonal coordinate system—where the electric field points in the direction 3 (i.e., FIG. 9A)—and the strain is in the 1 axis (i.e., orthogonal to the polarization axis). An alternative mode of operation, which has been considered by the inventors is a $d_{33}$ mode, which occurs when polarization is in direction 3 of the cylindrical coordinate system—where the electric field points in the direction 3 (i.e., FIG. 9B)—and the strain (deflection) is along the same axis. Thus, operation in the $d_{31}$ mode (with reference to FIG. 9A) will include having polarization in the Z-axis (direction 3) extending out of the piezoelectric material, where the E-field will be applied in the Z-axis (direction 3). On the other hand, operation in the $d_{33}$ mode reflects the coordinate system shown in FIG. 9B, where, the poling direction is in the R (radial) axis (direction 3) with the applied E-field also being in direction 3.

In the $d_{31}$ mode, applying the E-field in direction 3 at a first polarity causes the piezoelectric to expand, and reversing the polarity causes contraction.

In the $d_{33}$ mode, when the generated E-fields are parallel to the poling direction, the design is in a parallel state, and the piezoelectric will expand. When an expanding piezoelectric is built on or otherwise attached to a diaphragm, the expansion of the piezoelectric causes bending motion of the diaphragm, thereby resulting in the overall structure moving to a convex position when observed from the piezoelectric side. Contraction of the piezoelectric will occur when the E-field is anti-parallel the poling direction, which pulls in the piezoelectric, causing a counter bending reaction in the diaphragm, resulting in movement to a concave position. Thus, in the two-region diaphragm structure such as structures 40 and 50, actuation of the first area causes a length change in the Radial direction and actuation of the second area causes a length change in the Radial direction of an opposite sign of the first area.

In the embodiments of FIGS. 2A, 2B, 3A, 3B, 5A, 5B and 6A, 6B, both the polarization axis and the applied electric field are applied in the plane of the piezoelectric along the R-axis. Thus, operation is in a $d_{33}$ mode, as mode $d_{33}$ applies when the electric field is along the polarization axis (direction 3) and the strain (deflection) is measured along the same axis. The common mode of operation for existing diaphragm structures is to operate in a $d_{31}$ mode which applies when the polarization and the E-field are in the Z-direction as before, but the strain is in the 1 axis (i.e., orthogonal to the polarization axis). FIGS. 4A and 4B operate in this manner.

Figure 10A:
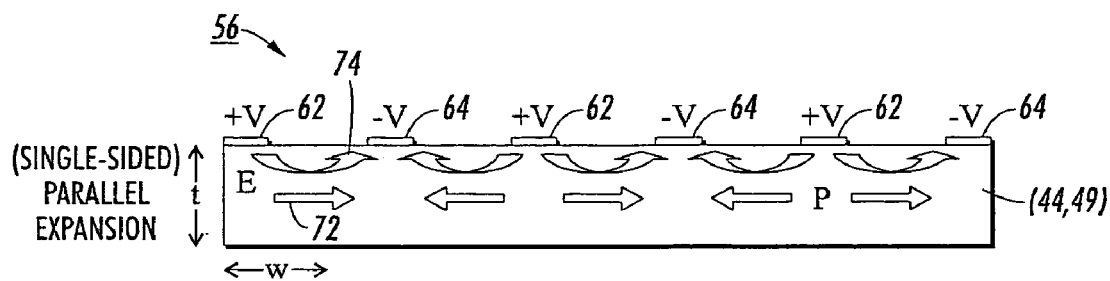
FIG. 10A illustrates a partial view of an inter-digitated electrode arrangement in a parallel piezoelectric expansion state.

To illustrate operation in the $d_{33}$ mode, attention is directed to FIG. 10A, which shows a partial view of inter-digitated electrode arrangement (IDE) 56 carried on a piezoelectric (e.g., 44 or 49) where the mode of actuation is the $d_{33}$ mode, i.e., both the poling and E-field are in-plane with the piezoelectric and pointed in the R-axis direction. This design, makes it possible to take advantage of the transverse changes in geometry obtained in the $d_{33}$ mode, which are two to three times larger than the transverse changes available in the $d_{31}$ mode, for most piezoelectric materials. The preceding concepts may also be applicable to the two-region diaphragm structure 50. However, as that embodiment does not use an IDE (with a plurality of electrodes) the figures would be slightly different.

In FIG. 10A, the poled direction is illustrated by arrows 72, which are generally or at least partially in-plane with the piezoelectric. The generated E-fields are shown by arrows 74, which are parallel to the arrows representing poling direction 72. When in a parallel state, the piezoelectric will expand when voltage is applied to the electrodes of IDE 56.

When an expanding piezoelectric is built on or otherwise attached to a diaphragm, the expansion of the piezoelectric causes bending of the diaphragm. The convex region near the clamp 60 causes more motion than the region in the center, thus forcing the center region downward and forcing a concave shape near the center.

Figure 10B:
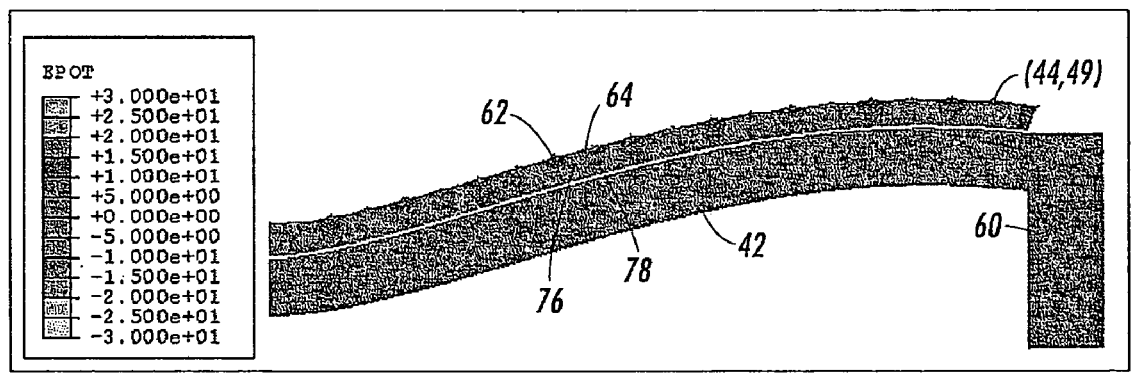
FIGS. 10B and 10C show a diaphragm structure in a concave position.
Figure 10C:
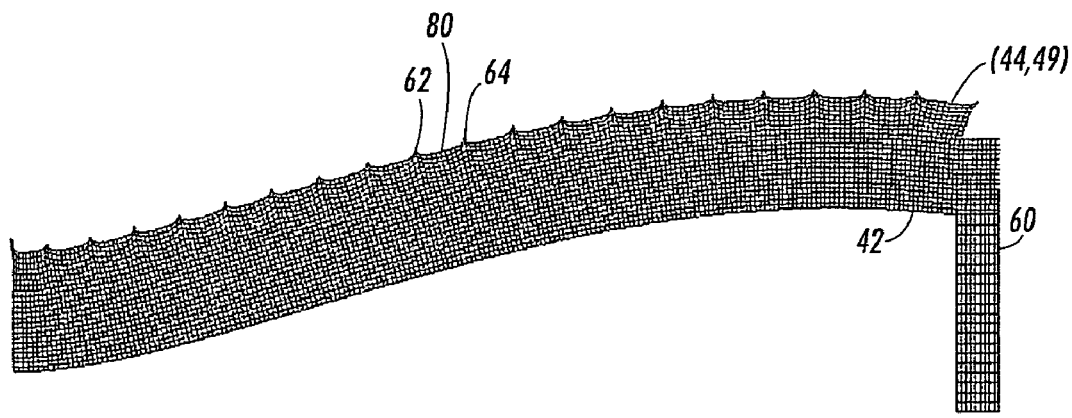

This concept is illustrated more particularly in connection with FIGS. 10B and 10C. In FIG. 10B, base or clamp 60 holds one end of diaphragm 42, which carries piezoelectric material (e.g., 44 or 49). As previously mentioned, operation is in the $d_{33}$ mode as E-fields are formed by application of voltage to electrodes (e.g., 62, 64), the piezoelectric material begins to expand, causing the thickness of the inter-electrode regions 80 to grow thinner. This pushes electrodes 62, 64, forming a scalloped top surface as shown in FIG. 10C. It is noted that FIG. 10C is exaggerated for explanation purposes.

With continuing attention to FIG. 10B, the depth of the applied positive 76 and negative 78 voltages into the piezoelectric (e.g., 44 or 49) are visually illustrated. In this embodiment, the value of the applied voltage ranges from +3 volts to −3 volts.

Figure 11A:
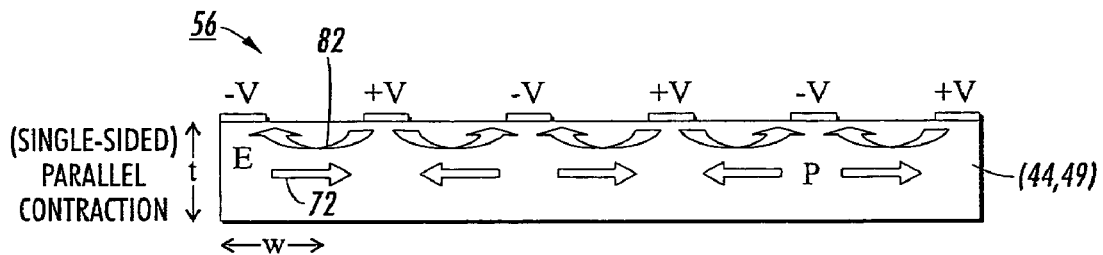
FIG. 11A illustrates a partial view of an inter-digitated electrode arrangement in an anti-parallel piezoelectric contraction state.
Figure 11B:
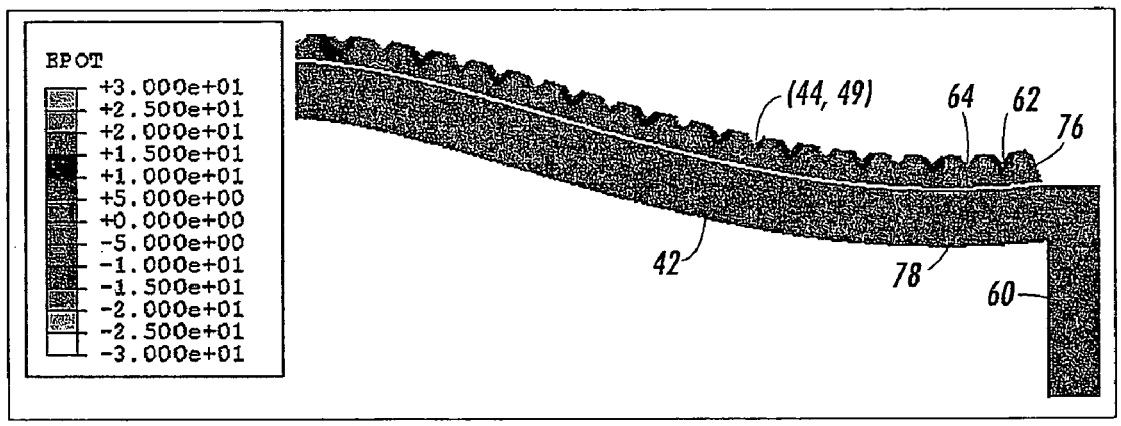
FIGS. 11B and 11C show a diaphragm structure in a convex position.
Figure 11C:
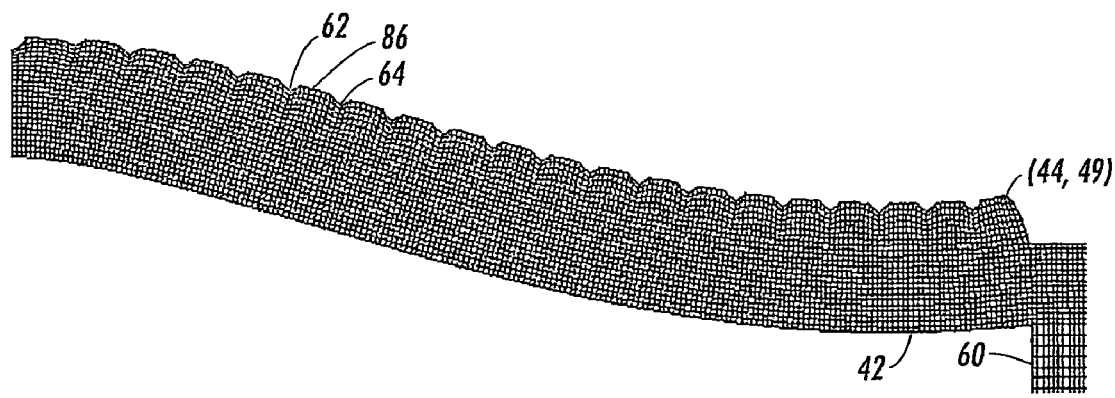

Turning to FIG. 11A, shown is inter-digitated electrode (IDE) configuration 56, such as in FIG. 10A, except that the applied E-field 82 is anti-parallel to the poled direction 72. This arrangement results in a contraction of the piezoelectric (e.g., 44 or 49). As depicted in FIGS. 11B and 11C, contraction of the piezoelectric results in the inter-electrode regions 86 to bulge above electrodes 62 and 64. This contraction pulls in the piezoelectric, causing a counter bending reaction in diaphragm 42, resulting in movement to a concave position in the region near the clamp.

Thus, when E-fields are applied parallel to and in-plane with the poling direction, the piezoelectric expands causing the inter-electrode regions to stretch sideways, pulling in the surface to conserve volume and leaving the electrode regions to form small protrusions. For contraction, the E-fields are in-plane with and anti-parallel to the poling direction, causing the inter-electrode regions to contract sideways, pushing out the surface, and leaving the electrode regions to form depressions.

The foregoing has described diaphragm structures which provide improvements over existing diaphragm structures by implementing a circular diaphragm with inter-digitated or two electrode control, where the applied E-field is in-plane with the poling direction, such that the diaphragm structure operates in a $d_{33}$ mode. The described diaphragm structures may be operated as a piezoelectric disc design or a piezoelectric annular ring design.

The performance of the described diaphragm structures depends on several factors, including: the pitch (p) of the electrodes, the electrode duty cycle (w/p—i.e., width-to-pitch ratio), the resulting penetration of the E-field, and the nominal E-field strength. For efficient usage, the pitch is maximized while minimizing electrode duty cycle for any level of E-field strength. The piezoelectric effect is a volumetric response that is dependent on the penetration of E-fields into the piezoelectric. The depth of penetration depends on a ratio between the pitch (p) to piezoelectric thickness ($t_{PZT}$) (i.e., $p/t_{PZT}$) which, as will be described, has been determined to be approximately 5 for a practical implementation using a single-sided IDE design. As noted, a second IDE may be added to an opposite surface of the piezoelectric to improve the piezoelectric effect. In comparison to the $d_{31}$ mode traditionally used in parallel plate electrode (PPE) configurations, in the $d_{33}$ mode the bias voltage scales only with the electrode pitch, not the piezoelectric thickness.

Figure 12:
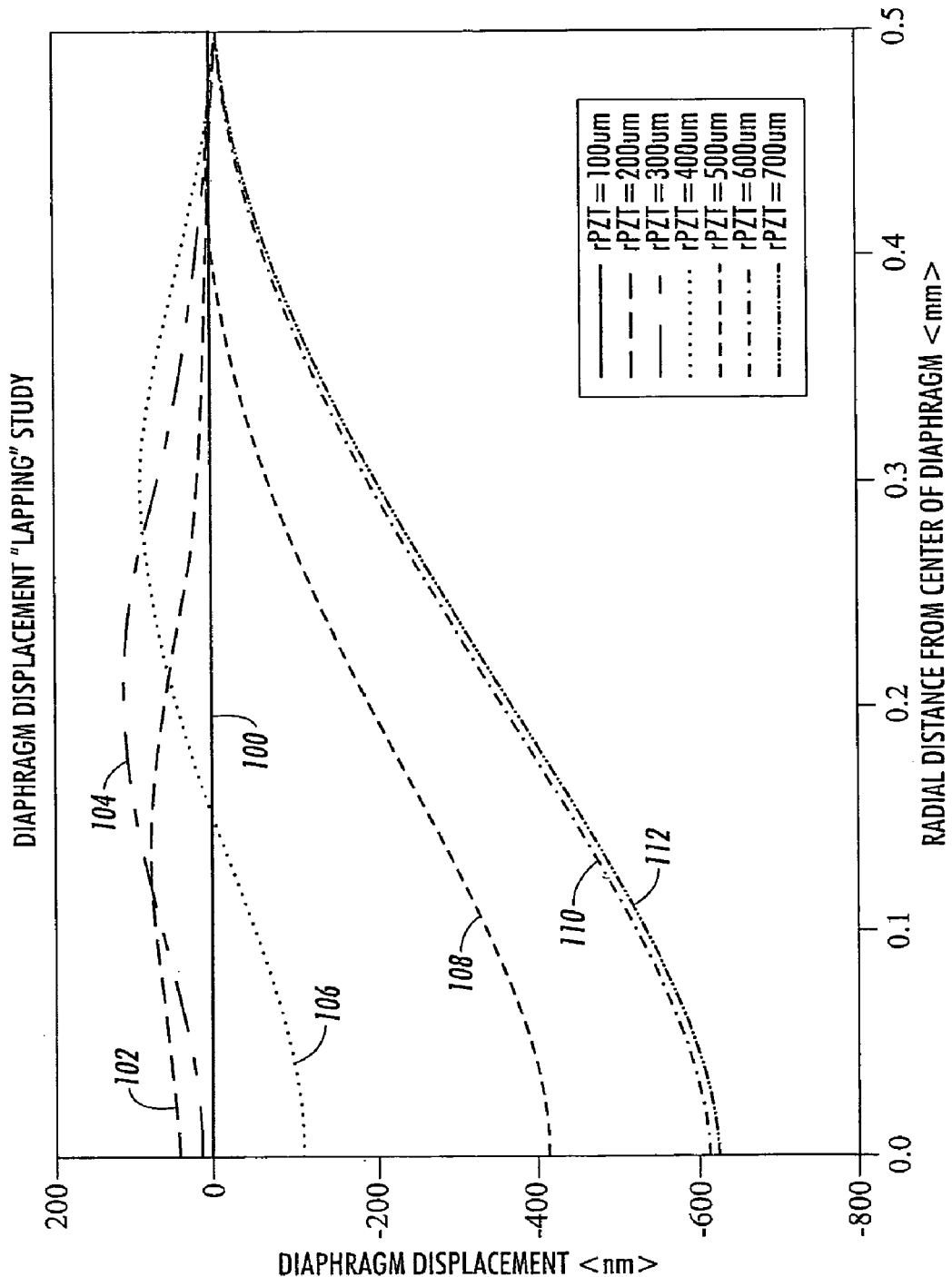
FIG. 12 is a chart presenting the results of a diaphragm displacement lapping study.

The chart of FIG. 12 presents the results of a finite element simulation of a piezoelectric on stainless steel diaphragm related to diaphragm displacement and the effects of overlapping and underlapping between the piezoelectric and the diaphragm, (i.e., $r_{PZT}/r_{Diap}$). The study used the following specifications: Diaphragm radius ($r_{Diap}$)=0.5 mm (500 μm), Piezoelectric thickness ($t_{PZT}$)=20 μm, Diaphragm thickness ($t_{Diap}$)=35 μm, height (h)=2.5 μm, Electrical field (E)=3V/μm, Pitch (p)=100 μm, and Duty cycle (dc)=10%.

The simulation investigated a variety of scenarios where a 500 μm circular diaphragm was actuated by circular piezoelectric discs ranging from 100 μm to 700 μm in diameter. The developed curves 100-112 are plotted to reflect the diaphragm displacement (nm) in accordance with a radial distance from the center of the diaphragm (mm). Curves 100-112 show the transition of the diaphragm shape, which has a positive displacement for piezoelectric discs with smaller radii, and rapidly evolves into negative displacements for piezoelectric discs having larger radii, e.g., from 400 μm (0.8 underlap) to 700 μm (1.4 overlap). Curve 100 shows no deflection, since there was only one electrode on the piezoelectric.

Curve 112 represents a situation where the radius of the piezoelectric ($r_{PZT}$)=700 μm, whereas the radius of the diaphragm ($r_{Diap}$) is 500 μm, resulting in a 200 μm overlap. Measured at the center of the diaphragm, the displacement is over −600 nm as shown by curve 112. Thus, the largest diaphragm displacement in this study occurs when $r_{PZT}$=700 μm. The displacement characteristics of the remaining curves may be understood from the foregoing discussion.

Figure 13:
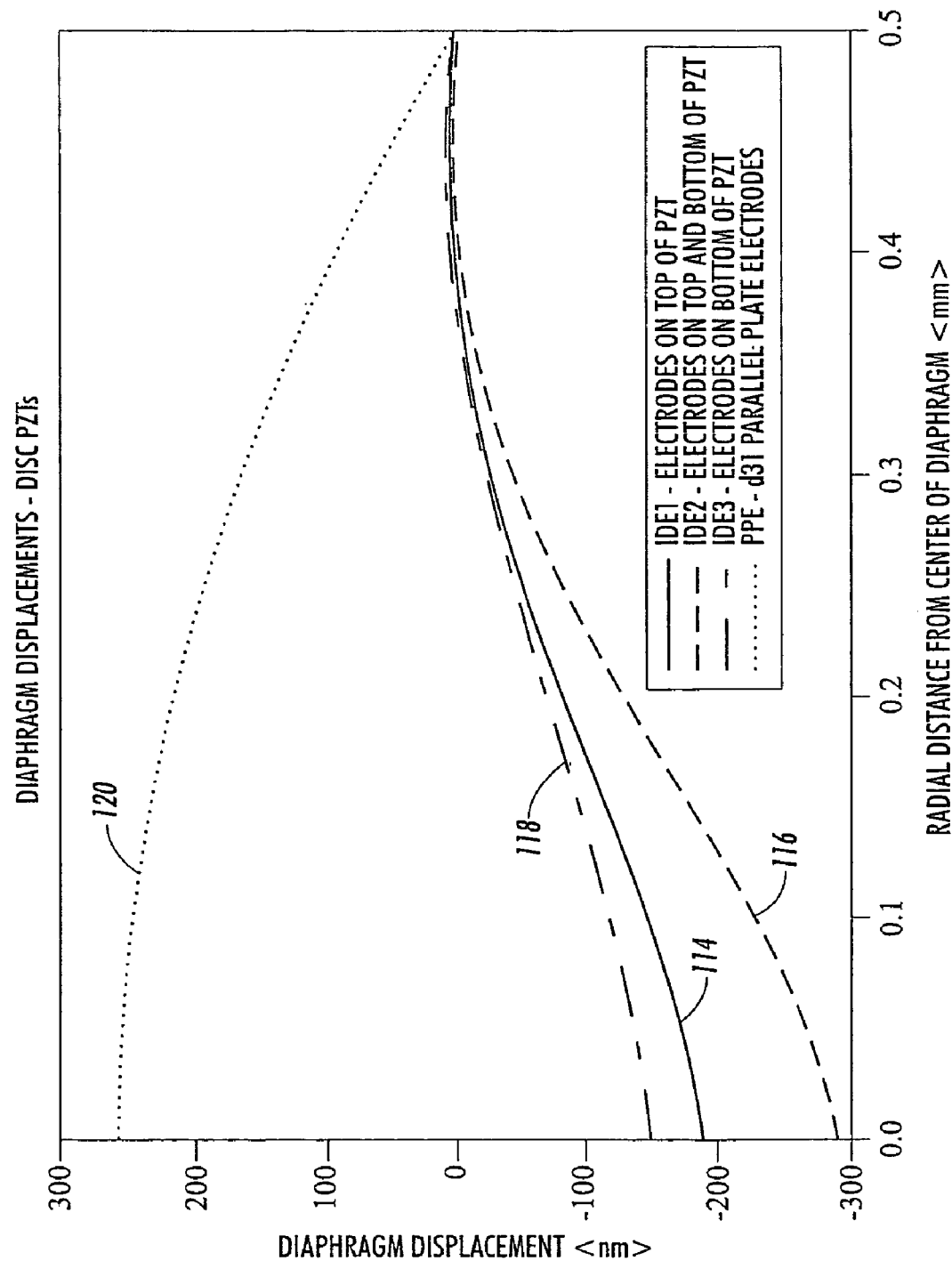
FIG. 13 is a chart representing a diaphragm displacement study for a disc piezoelectric.
Figure 14:
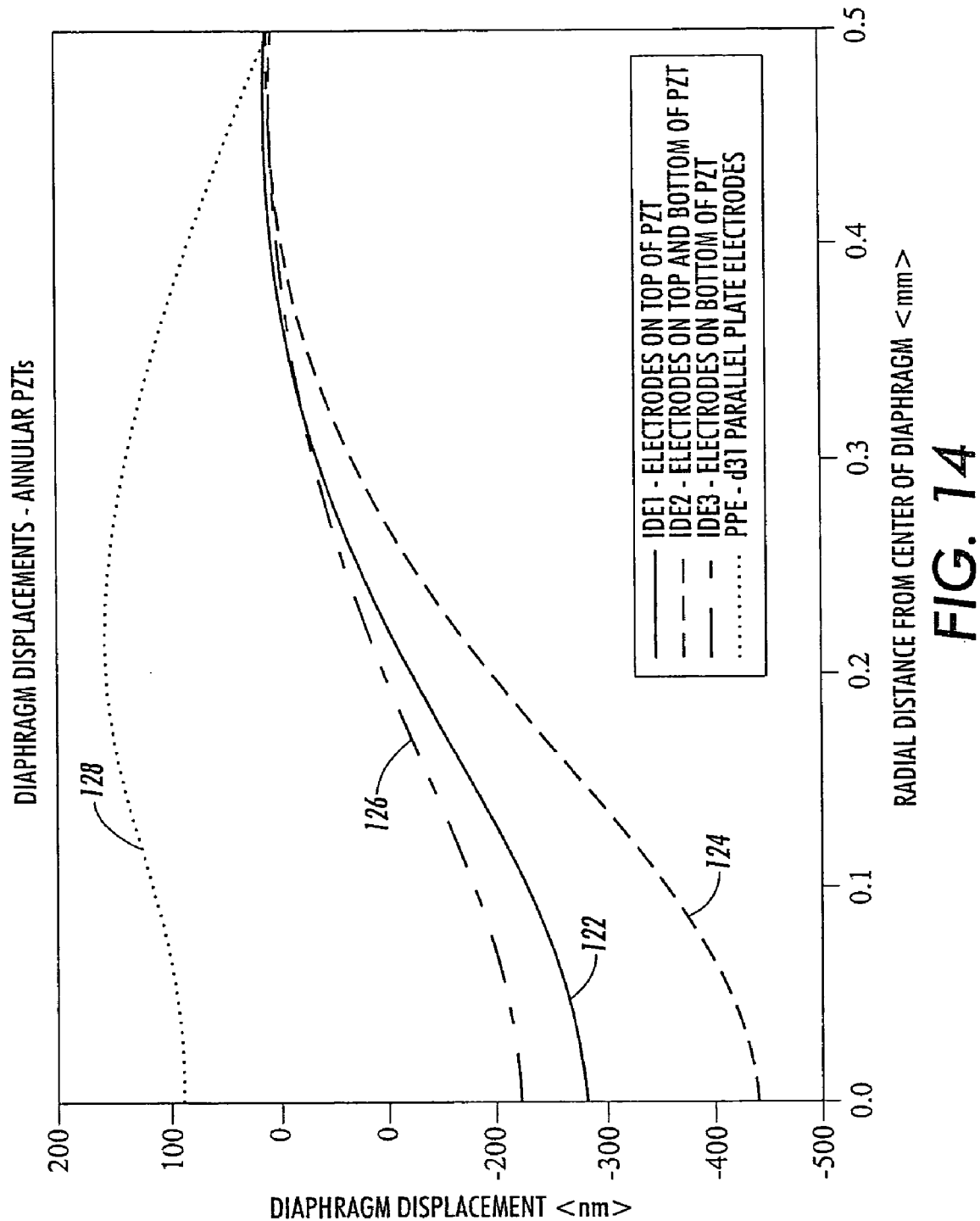
FIG. 14 illustrates a diaphragm displacement study for an annular ring piezoelectric.

Attention is now directed to comparing the diaphragm displacement efficiency between a disc diaphragm structure 40 and an annular ring diaphragm structure 48. Turning to FIGS. 13 and 14, illustrated are charts plotting the results of finite element simulations of diaphragm displacement (nm) based on the radial distance from the center of the diaphragm (mm) for the disc structure and the annular ring structure. These charts compare three different inter-digitated electrode arrangements, where electrodes are on top of the piezoelectric (IDE 1) 114, 122, electrodes on top and bottom of the piezoelectric (IDE 2) 116, 124, and electrodes on the bottom of the piezoelectric (IDE 3) 118, 126. Each chart also plots a curve for a system implementing a known parallel plate electrode (PPE) design 120,128. In this study, the following parameters were used: $t_{PZT}$=20 μm, $r_{Diap}$=0.5 mm (500 μm), $t_{Diap}$=38 μm, $r_{PZT}$=0.5 mm (500 μm), p=25 μm, dc=20% and E≈3V/μm.

The results of this study confirm for both structures that the double-sided (IDE2) design provides the largest displacement. In FIG. 13 the diaphragm displacement for the IDE2 disc design is about −300 nm, according to curve 116. Due to the radial inward compression experienced by the actuated piezoelectric, displacement is constrained when the center of the disc thickens due to radial stress. To improve this performance, a small circular piezoelectric portion is removed at the center of the diaphragm for stress relief so that the piezoelectric can expand. With, for example, a 100 μm piezoelectric portion removed from the center, and the resulting annular ring structure subjected to the same driving conditions as for the disc structure, the IDE2 curve 124 shows a displacement of about −440 μm. The dip on the left of the PPE curve 128, is due to the loss of the piezoelectric material at the center.

Figure 15:
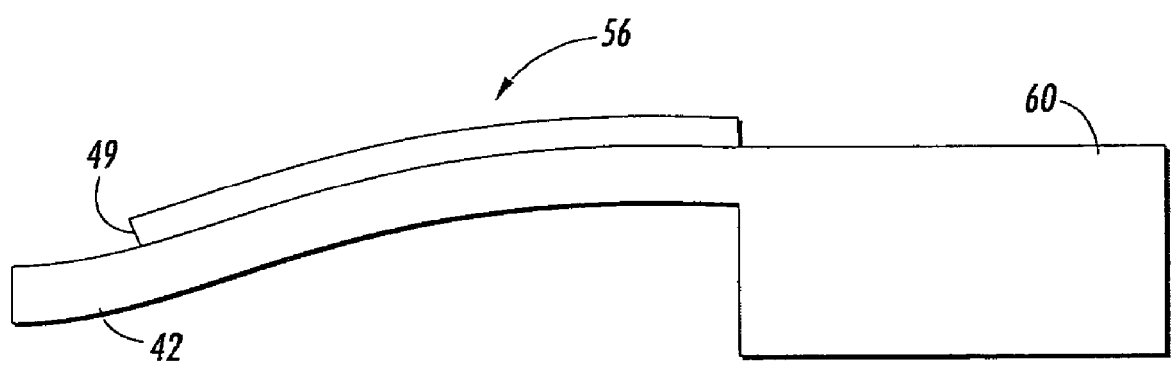
FIG. 15 is a partial side view of diaphragm displacement in accordance with parameters of FIG. 10B.

With continuing attention to annular ring structure 48, FIG. 15 is a partial side view of diaphragm displacement in accordance with the parameters of FIG. 14 having IDE 56 only on the top surface of piezoelectric annular ring 49, which is driven in a parallel expansion $d_{33}$ mode.

Figure 16:
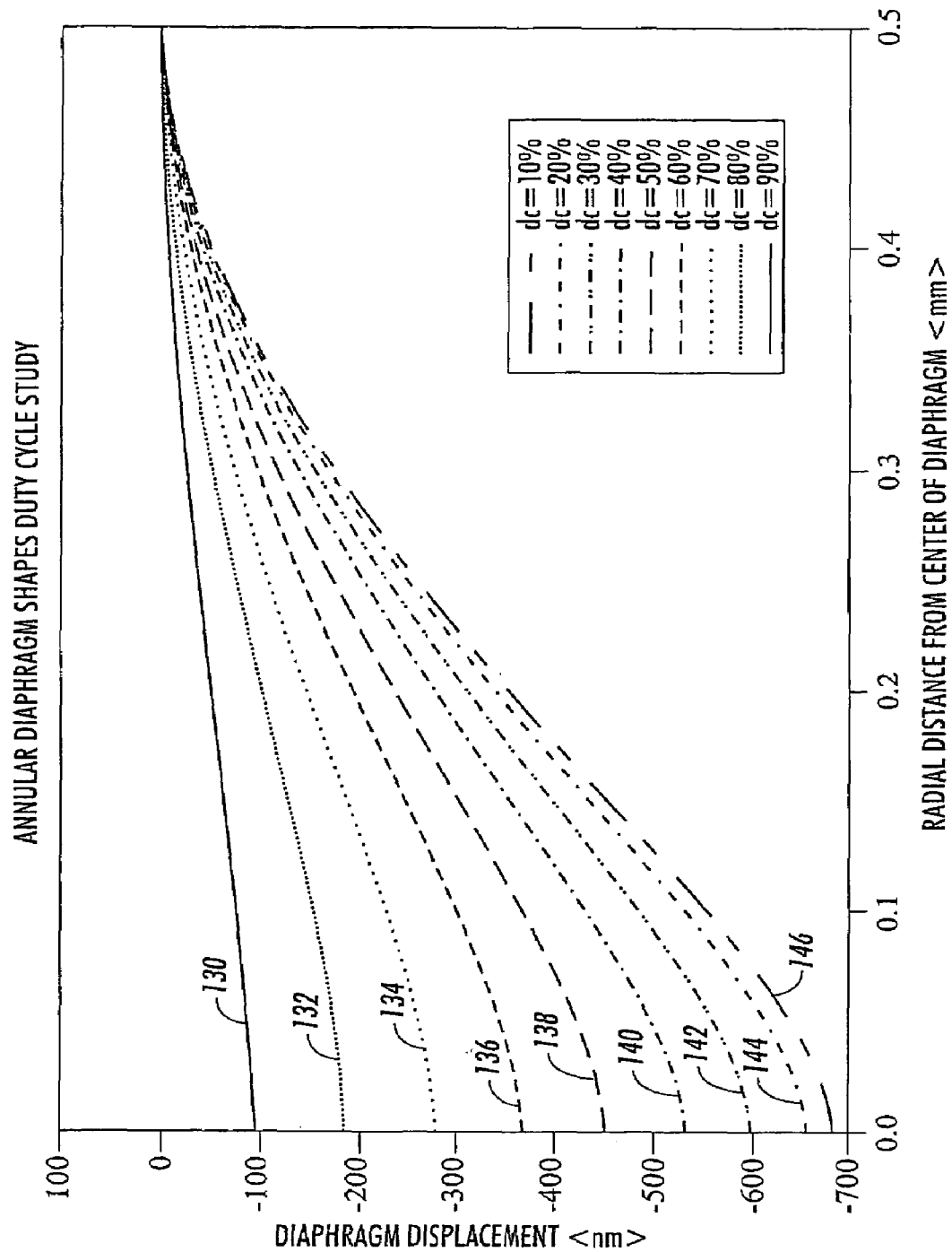
FIG. 16 is a chart containing the results of diaphragm shapes formed due to relative electrode width (i.e., duty cycle) variations.

The chart of FIG. 16 contains a set of curves 130-146 for the annular piezoelectric diaphragm structure 48, such as partially depicted in FIG. 15. The curves define diaphragm displacement (nm) versus the radial distance from the center of the diaphragm over a plurality of duty cycles (i.e., where the duty cycle is considered to be the width to pitch ratio (w/p)) ranging from 10% to 90%. The diaphragm displacement, and therefore volume displacement variation, is monotonic over the varying duty cycles. The lower duty cycles (e.g., 10%) generate the greatest negative diaphragm displacement as shown by curve 146.

Understanding the benefits of overlapping/underlapping of the piezoelectric, the use of IDEs, and the characteristics of a disc versus an annular ring in a diaphragm structure operating in a d33 mode, further finite element simulations at various underlapping or overlapping values were performed to determine optimal diaphragm structures. TABLE 1 provides some results of the simulations, as plotted in FIG. 12, for the listed specifications where an IDE is located only on the top surface. The study increased the size of the piezoelectric ($r_{PZT}$) in 50 μm steps.

TABLE 1

IDE1 ($d_{33}$) "Lap" Studies
$r_{Diap}$ = 0.5 mm, $t_{PZT}$ = 20 μm, $t_{Diap}$ = 38 μm, E ≈ 3 V/μm,
p = 100 μm, dc = 10% overlap

| Case | $r_{PZT}$ (um) | $r_{PZT}/r_{diap}$ | $U_{max}$ (nm) | ΔV (pL) | Cv (pL/V) |
|---|---|---|---|---|---|
| UNDER | 100 | 0.20 | 4.89 | 0.33 | 0.0012 |
| | 150 | 0.30 | 3.21 | 3.73 | 0.0138 |
| | 200 | 0.40 | 44.82 | 18.09 | 0.0670 |
| | 250 | 0.50 | 54.62 | 23.69 | 0.0877 |
| | 300 | 0.60 | 18.65 | 36.21 | 0.1341 |
| | 350 | 0.70 | 11.23 | 40.94 | 0.1516 |
| | 400 | 0.80 | −109.15 | 30.49 | 0.1129 |
| | 450 | 0.90 | −156.42 | 22.41 | 0.0830 |
| EVEN | 500 | 1.00 | −414.40 | −54.94 | −0.2035 |
| OVER | 550 | 1.10 | −506.10 | −89.70 | −0.3322 |
| | 600 | 1.20 | −613.52 | −133.89 | −0.4959 |
| | 650 | 1.30 | −619.41 | −136.31 | −0.5049 |
| | 700 | 1.40 | −624.94 | −138.54 | −0.5131 |
| | 750 | 1.50 | −625.97 | −138.96 | −0.5147 |

Use of a double-sided IDE (i.e., IDE 2) will result in larger displacements for the 20 μm piezoelectric as the in-plane E-fields are higher. Selecting the 20% overlap results as providing a desirable diaphragm displacement.

Figure 17:
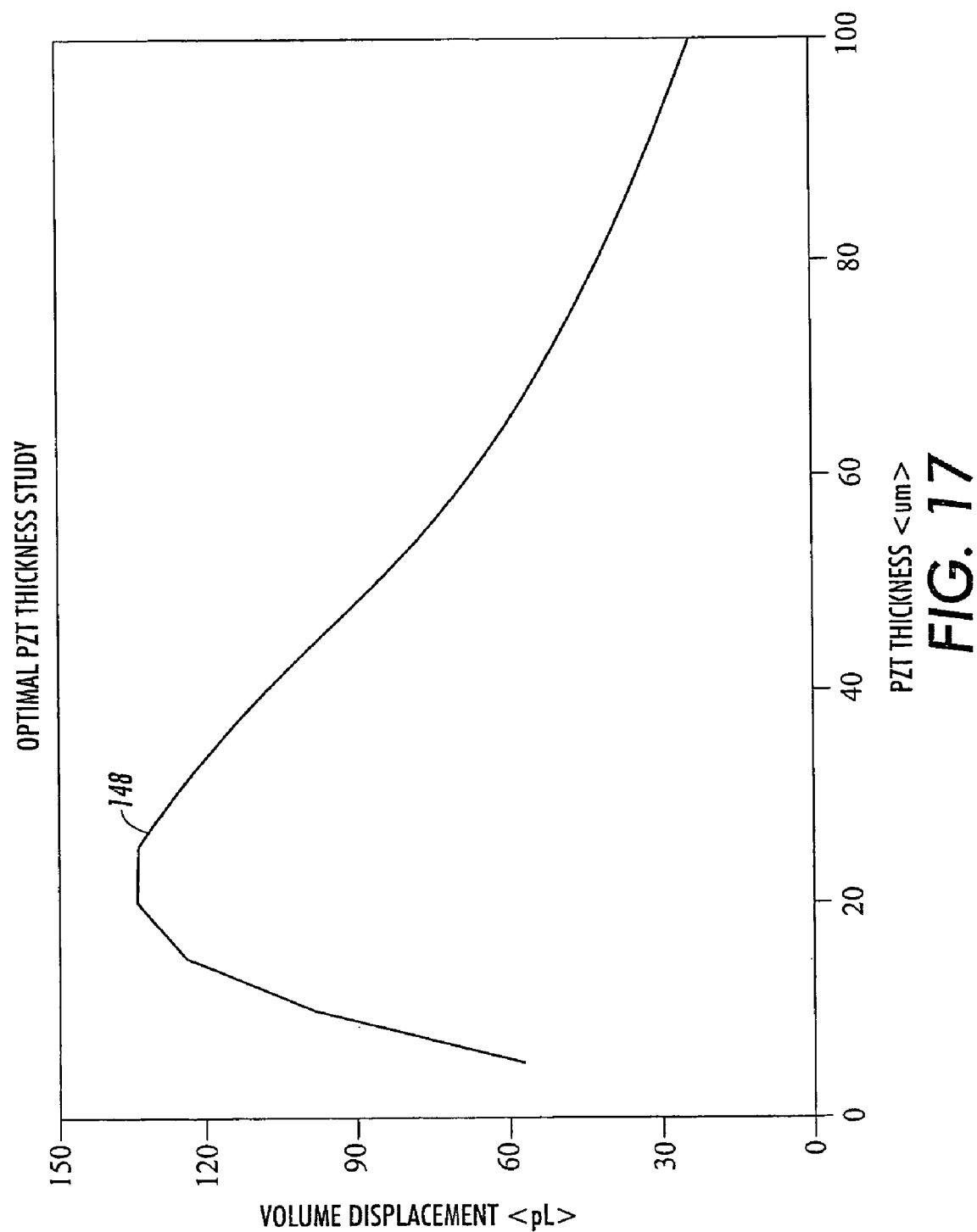
FIG. 17 presents a curve illustrating, an optimal piezoelectric thickness.

The limitation to pitch is the high voltage required to maintain the E-field at 3V/μm with increasing inter-electrode spacing. Assuming a practical pitch of 100 μm, 10% electrode duty cycle, and 20% overlap, the optimal piezoelectric thickness is determined by comparing the computed diaphragm (−$U_{max}$) and volume (−ΔV) displacements. In Table 2, the optimum thickness for maximum displacement (i.e., 613.52 μm and 133.89 pL) is about 20 μm. This result is also shown as the peak of curve 148 in FIG. 17, and results in a p/$t_{PZT}$ of 5, although a range where the pitch of the electrodes being 2 to 8 times the thickness of the piezoelectric would also provide useful results.

TABLE 2

IDE1 Optimal Pitch Studies
p = 100 μm, dc = 10%,
$r_{Diap}$ = 0.5 mm, $t_{Diap}$ = 38 μm, E ≈ 3 V/μm, 20% overlap

| $t_{PZT}$ (um) | $t_{PZT}/p$ | −Umax (nm) | −ΔV (pL) |
|---|---|---|---|
| 5 | 0.05 | 263.17 | 56.62 |
| 10 | 0.1 | 459.42 | 99.39 |
| 15 | 0.15 | 571.06 | 124.18 |
| 20 | 0.2 | 613.52 | 133.89 |
| 25 | 0.25 | 610.06 | 133.29 |
| 30 | 0.3 | 580.52 | 126.61 |
| 40 | 0.4 | 492.46 | 106.12 |
| 50 | 0.5 | 403.95 | 85.08 |
| 60 | 0.6 | 329.45 | 67.08 |
| 70 | 0.7 | 269.91 | 52.58 |
| 80 | 0.8 | 222.84 | 41.03 |
| 90 | 0.9 | 185.48 | 31.87 |
| 100 | 1.0 | 155.57 | 24.59 |

Figure 18:
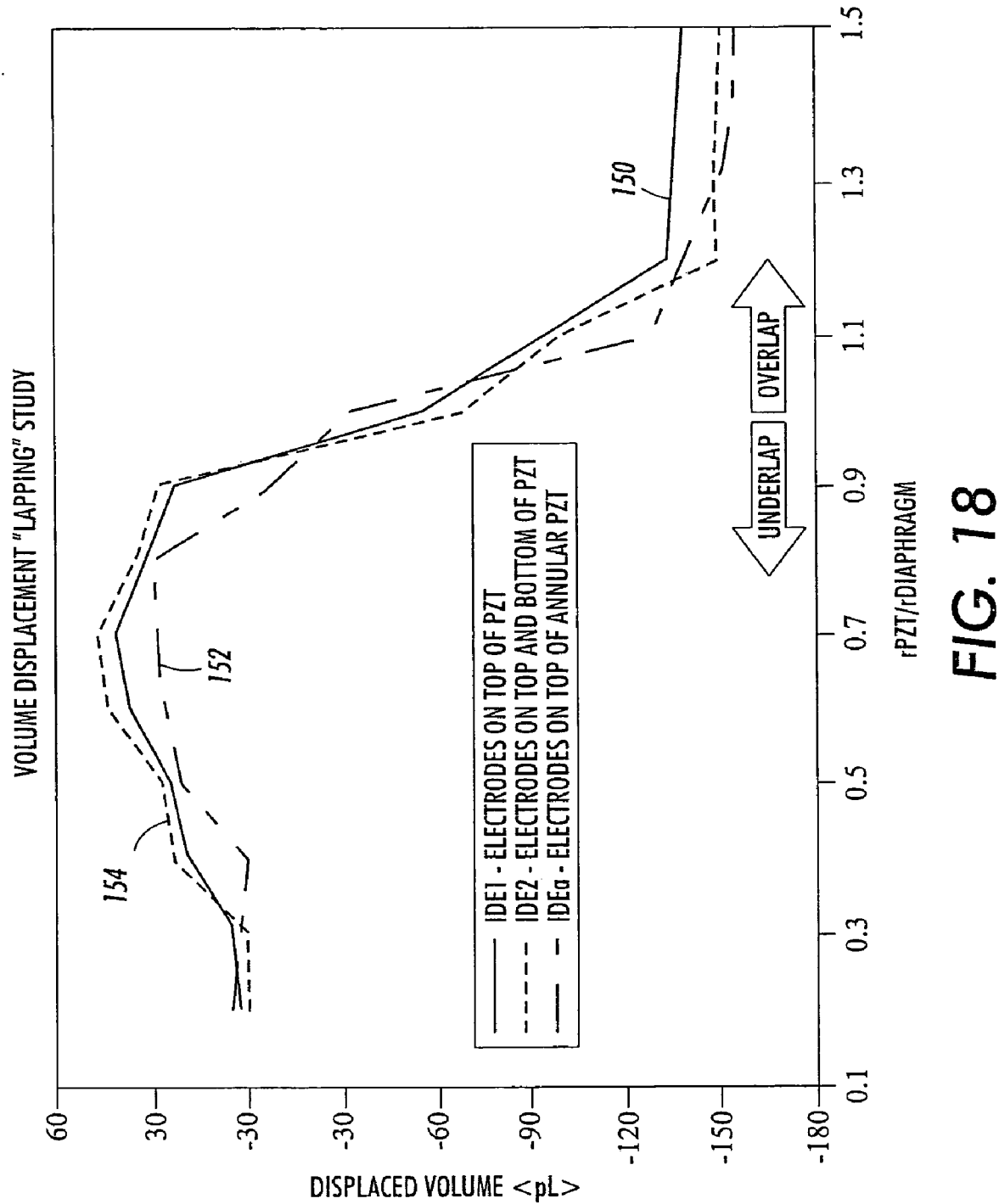
FIG. 18 illustrates the results of a volume displacement lapping study for various underlap and overlap positions.

Another characteristic to consider in optimizing the diaphragm structure are the variations of volume displacement due to different underlap and overlap conditions. FIG. 18 shows the results of this investigation for the disc and annular ring piezoelectric diaphragm structure. Each structure includes a diaphragm having a radius ($r_{Diap}$) of 500 μm, a thickness ($t_{Diap}$) of 38 μm, and a piezoelectric annular ring with a radius ($r_{PZT}$), which varies from an underlapping situation (i.e., less than 1.0) to an overlapping situation (i.e., greater than 1.0), and a thickness ($t_{PZT}$) of 20 μm. Curve 150 is for a single-sided disc diaphragm structure with an IDE on top of the piezoelectric and curve 154 is for a disc diaphragm structure with a double-sided IDE arrangement. The third curve 152 is for an annular ring diaphragm structure with 100 μm radius piezoelectric portion removed. The curves indicate that the volume displacements are smaller and positive for underlap situations, but there is a transition over to larger and negative displacement for overlap situations, with little change beyond 20% overlap for both the disc and annular ring diaphragm structures.

Turning attention to the annular ring design, the optimal inner radius of the annular ring 49 was determined by varying the annular radius from 400 μm to 0 μm. The simulation showed the peak displacement is located at an annular radius of 300 μm. TABLE 3 lists results at various operational values for different annular radii ($r_{annulus}$).

TABLE 3

Performance of annular piezoelectric
$r_{diap}$ = 500 μm,
$t_{diap}$ = 38 μm, $t_{PZT}$ = 20 μm, E = 3 V/μm (Cv), P = 2 atm (Cp)

| $r_{annulus}$ <um> | ΔV <pL> |
|---|---|
| 400 | 143.58 |
| 300 | 196.69 |
| 200 | 193.69 |
| 100 | 157.10 |
| 0 | 126.85 |

Thus, from the foregoing it has been determined for a disc piezoelectric diaphragm structure, large volume displacements for voltage applied is optimized in a range of 10% to 30% overlap, and preferably at 20% overlap or a disc radius of 600 μm, covering a 500 μm diaphragm. Volume displacements are even larger for annular ring piezoelectric diaphragm structures; peaking, again, when there is an underlap of the inner radius in a range of 30% to 50%, and preferably 40% (i.e., the inner radius is about 300 μm) and the outer radius is 600 μm (i.e. 20% overlap). Of course, benefits from under and overlapping may be obtained in other ranges, such as where an inner radius (edge) dimension underlaps the diaphragm by approximately 10-50% and the outer radius edge dimension overlaps the diaphragm by approximately 3-30%.

Figure 19:
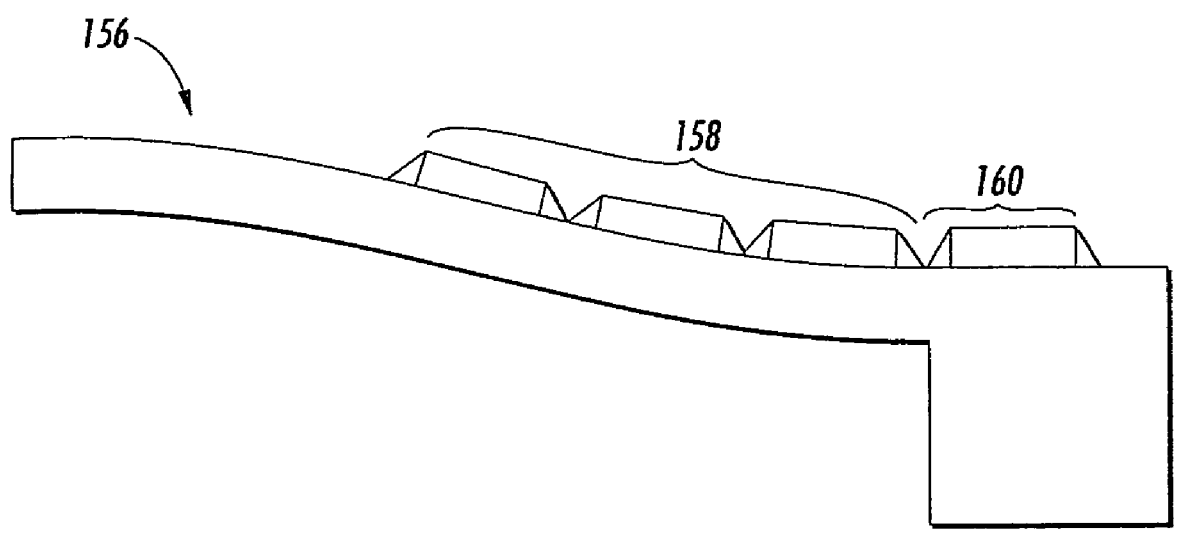
FIG. 19 depicts a partial view of an optimized annular ring diaphragm structure in accordance with the present application.

FIG. 19 shows a simulation of the annular ring diaphragm structure 156 optimized with 40% underlap of the inner radius 158 and 20% overlap of the outer radius 160.

Turning attention to two-region diaphragm structure 50 of FIGS. 4A, 4B and 7A, 7B, in one embodiment both the annular ring 51 and disc 52 are configured for operation in the $d_{31}$ mode. In this design, one of the regions, for example the disc electrode 54b, as illustrated in FIG. 7B, will have a positive voltage applied, and the annular ring electrode 54a will have a negative voltage applied relative to common bottom electrode 54c. Given uniform poling in a Z-axis, one region will expand, causing bending in a concave down fashion, and the other region will contract causing bending concave upwards. Both of these motions work together to provide a maximum total deflection. The selection where the occurrence of a concave-down versus a concave-up transition exists, is guided by the natural bending modes of the diaphragm and is shown by boundary 53.

The $d_{33}$ mode of operation makes it is possible for annular ring 51 and/or disc 52 to take advantage of the transverse changes in geometry obtained in the $d_{33}$ mode, which are two to three times larger than the transverse changes available in the $d_{31}$ mode, for most piezoelectric materials.

Figure 20:
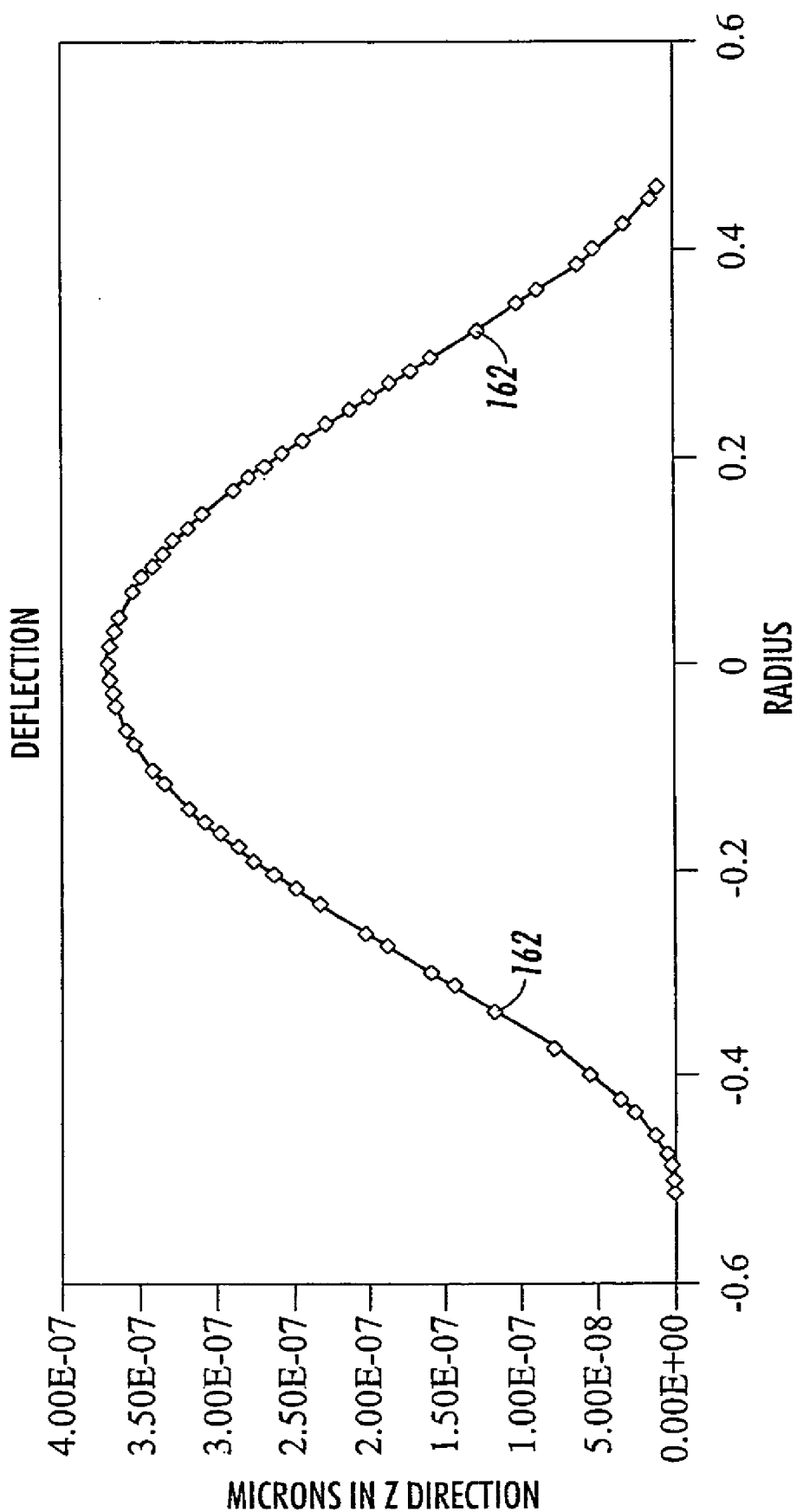
FIG. 20 is a chart illustrating the results of deflection for a two-region diaphragm structure.

Since the selection of boundary 53 between annular ring 51 and disc region 52 does not affect stiffness, a simulation of the deformation of the diaphragm under applied pressure will appear the same for all locations of the boundary. FIG. 20 provides the results of such modeling for an active diaphragm having a 500 micron radius. A reasonable fit to the data provides a simple polynomial which can be solved analytically to define various features of the system. The radius of inflection in one dimension (R) and the radius which corresponds to the sum of the second derivatives (2-D equating to zero (2-D "inflection", a "saddle point" R, and Theta)) 162 is noted in FIG. 20. Alternatively, one may solve the full analytical expression for deformation and find the same point.

Figure 21:
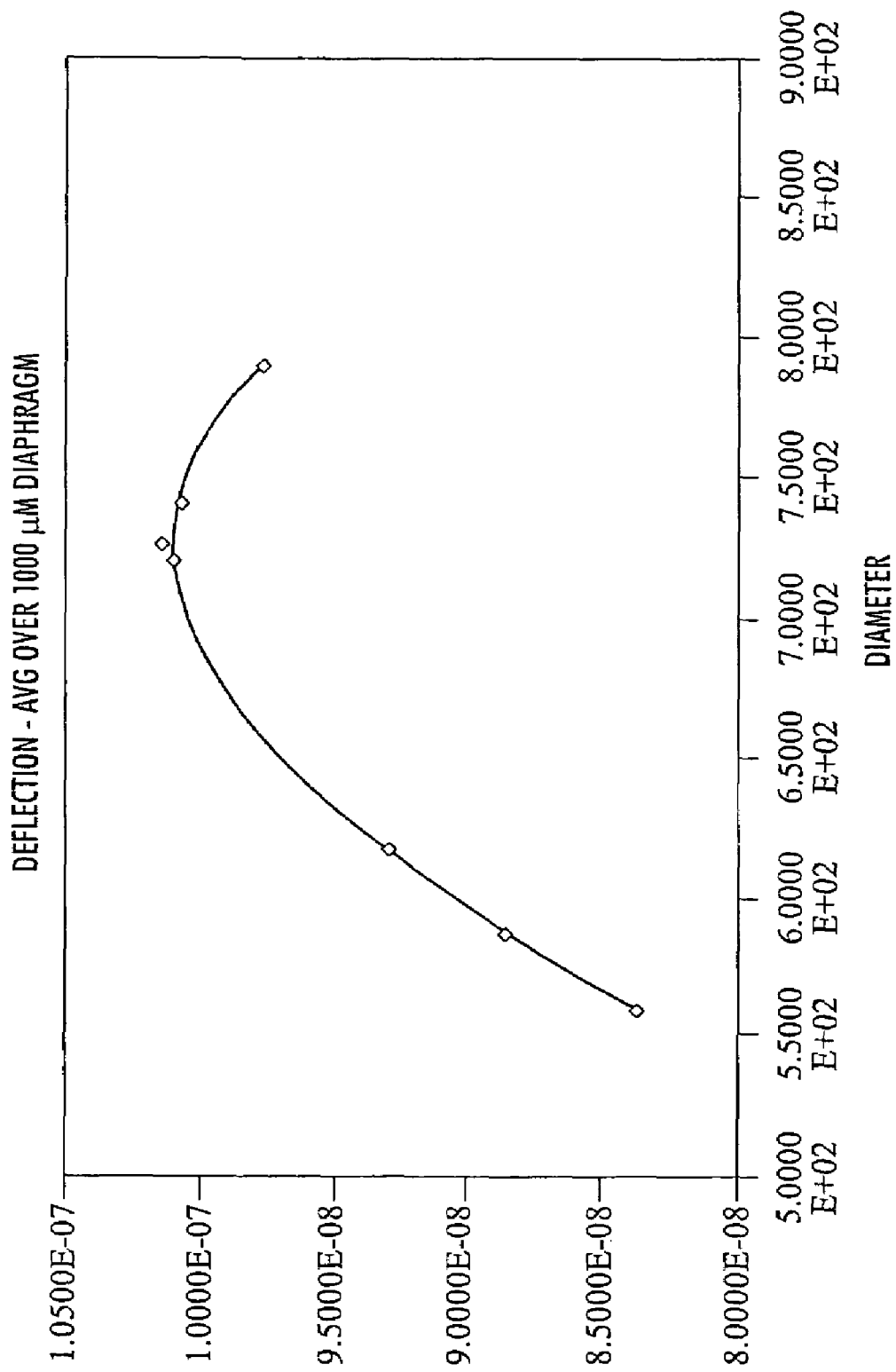
FIG. 21 is a chart depicting an optimum boundary point for a two-region diaphragm structure according to the present application.

Total 2-D inflection radius is the radius (e.g., approximately 0.36) where curvature in the X-axis plus the curvature in the Y-axis is equal to zero. On first inspection, it may be assumed that the optimum boundary location 53 would correspond to the inflection point on the R axis (1-D). However, the optimum boundary point turns out to be the 2-D inflection location, as illustrated in FIG. 21 (i.e., for a 1,000 micron diameter, each point is the result of a simulation run, and the optimum is approximately 73%, compared to the 72% from analysis in FIG. 20). For voltages applied oppositely to the disc 52 and the annular ring 51 (on their tops with respect to the bottom), the piezoelectric tends to curl down in the center and curl up around the edge. The ideal location for the boundary 53 utilizes this tendency to produce the optimal displacement of the diaphragm when voltage is applied.

From a simulation with a typical diaphragm structure, this two-electrode 54a, 54b design provides an approximate 57% improvement of volume displacement versus voltage over an optimal single electrode design (with diameters scaled to give matching $C_p$, where $C_p$ is volume displacement per unit pressure applied). The optimum $C_v$ (where $C_v$ is the volume displaced per unit volt applied) for a single electrode design, with a thickness of material used in this example, is with approximately 80% coverage of the diaphragm with the piezoelectric material.

In the described structure, increased deflection of the diaphragm occurs as compared to a single electrode design, since the contraction and expansion of the piezoelectric material is matched to the natural bending mode of the diaphragm. Contraction is initiated in the central region when it is desired to have a concave-up position. An expansion of the piezoelectric in the central region is used when it is desired to have a concave-down position (given that the piezoelectric is on top of the diaphragm). The overall stiffness pressure per volume displaced ($1/C_p$) is maintained and even improved over conventional single electrode construction, and the voltage requirement for actuation is decreased. Stated alternatively, the volume displaced per unit volt applied ($C_v$) is increased over single region designs.

In the preceding electrode configuration, annular ring 51 and disc 52 of diaphragm structure 50 were driven in the same $d_{ij}$ mode. The following describes an embodiment where a mixed poling and electric field arrangement is used for annular ring 51 and disc 52. Particularly, as shown in FIG. 22A-22B, construction of the present embodiment is similar to that previously described in that there are two regions of piezoelectric defined as the annular ring 51 and disc 52, which are concentric to each other and attached to diaphragm 42.

Figure 22A:
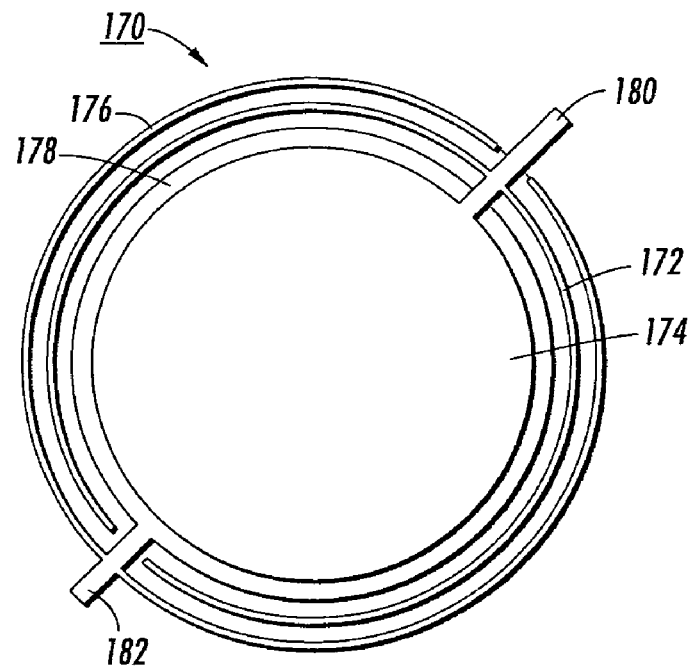
FIGS. 22A-22B show a top and side views of a diaphragm structure in accordance with the present concepts.
Figure 22B:
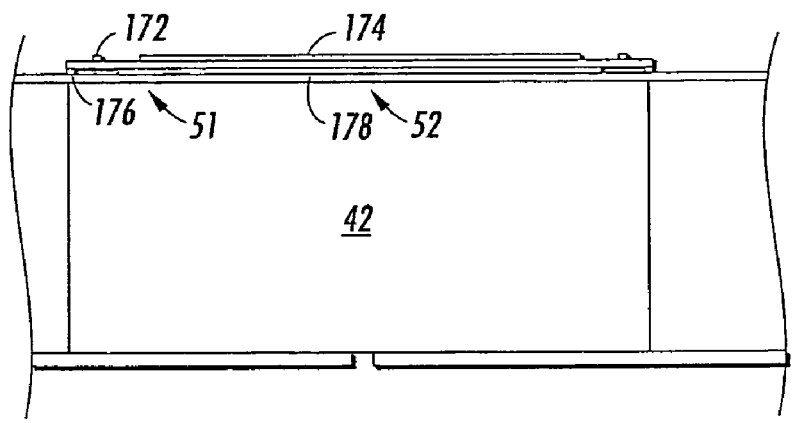

FIGS. 22A-22B emphasize the two-region design may include configurations with electrodes on both surfaces of the piezoelectric (i.e., an annular ring electrode and disc electrode arrangement on a second surface of the piezoelectric). More specifically, FIG. 22A depicts a diaphragm structure 170 with an annular ring electrode 172 and disc electrode 174 on a top surface of a piezoelectric (not shown), and an annular ring electrode 176 and disc electrode 178 on a bottom surface of the piezoelectric. The top surface electrodes 172 and 174 are provided with power via a conductor 180, and the bottom side electrodes 178 and 176 being provided with power via a conductor 182.

FIG. 22B (which is an enlarged section of FIG. 22A) more clearly illustrates the diaphragm structure 170 includes a staggered electrode design. More specifically, the top annular ring electrode 172 is offset or staggered from the position of bottom annular ring electrode 176. Similarly, top disc electrode 174 is also not aligned with bottom disc electrode 178. It is to be noted that an alternative embodiment includes the electrodes in a non-staggered or even arrangement.

With continuing attention to FIGS. 22A-22B, the outer bottom annular ring electrode in this embodiment may be designed with a diameter of 1.000 mm (1000 microns), the diameter of the upper annular ring electrode 172 is 0.910 mm (910 microns), the diameter of the lower disc electrode 178 is 0.830 mm (830 microns) and the diameter of the upper disc electrode 174 is 0.760 mm (760 microns). The distance of stagger between the lower annular ring electrode 176 and the upper annular ring electrode 172 is 0.035 mm (35 microns) It is to be appreciated the foregoing values are representative values which are not intended to limit the present embodiment, and it is to be understood other sizes and values may be used which permit implementation of the disclosed concepts.

As the entire diaphragm 42 is covered with piezoelectric material in the designs of FIGS. 22A-22B, the stiffness of the diaphragm is maintained over conventional designs, which tend to locate the edge of the piezoelectric close to the edge of the active diaphragm or somewhat interior, thereby causing the stiffness to be reduced at the edge of the active region, and thereby affecting the overall stiffness. This higher stiffness design is particularly beneficial in improving performance in fluid ejection applications as the resonance frequencies are maintained at a higher level in these designs.

In the present embodiments, actuation of the annular ring and the disc are accomplished by distinct modes of operation. The annular rings are poled and operated to function in a $d_{33}$ mode, whereas the disc regions are configured and operated in a $d_{31}$ mode.

To achieve these alternate modes of operation, the annular rings are poled in the R (radial) axis of a cylindrical coordinate system, and the discs are poled in the Z-axis of a classical right-hand coordinate system. In some applications, the vector of poling for the outer region (annular rings) may implement a complex function of position, since the poling would generally be accomplished by application of the high voltage to the electrodes of 3 to 15 times the operating voltage (1 to 5 times the coercive field strength). The field in the R axis would be established by adjustment of the voltages for optimum effect during the poling. The specific position and adjustment of voltages would vary from design and size of the piezoelectric. Such positioning would, however, upon the teaching of the present application be within the understanding of one of ordinary skill in the art. Therefore, for purposes of descriptions herein, the poling is considered to be radial in direction.

Employing this dual electrode design with differing driving conventions, permits multiple driving options. FIGS. 23A-23D are presented to illustrate various ones of these driving options, wherein for convenience these views show only one edge of annular ring 51 associated with disc 52. In particular, when the disc electrode 178 is grounded (i.e., $V_{bot1}$ in the figures), then varying combinations, and values of voltages $V_{top1}$, $V_{top2}$, and $V_{bot2}$ may be applied to electrodes 172, 174 and 176 respectively.

In FIGS. 23A-23D disc portions 52 have been poled to operate in the $d_{31}$ mode, wherein the electric field (E) is applied in a direction opposite the poled field (P). The annular ring portions 51 are poled in the radial direction (P). However, electrodes 172 and 176 (presented in a staggered configuration) have electric fields applied to alter their expansion and/or contraction states. For example, in FIG. 23A, both top electrode 172 and electrode 176 have E-fields applied to cause top region and bottom region expansion of the piezoelectric. This is illustrated by showing the arrows coming into the electrodes.

Figure 23A:
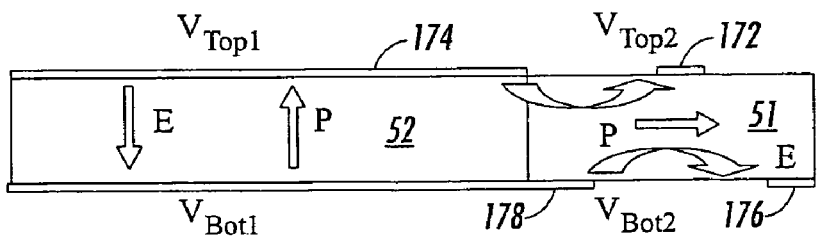
FIGS. 23A-23D are investigated options of the application of E-fields to the diaphragm structures in accordance with the present concepts.
Figure 23B:
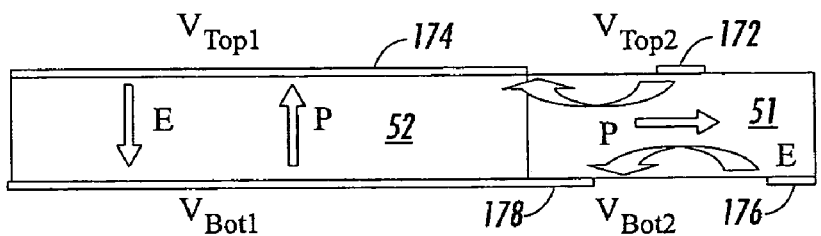
Figure 23C:
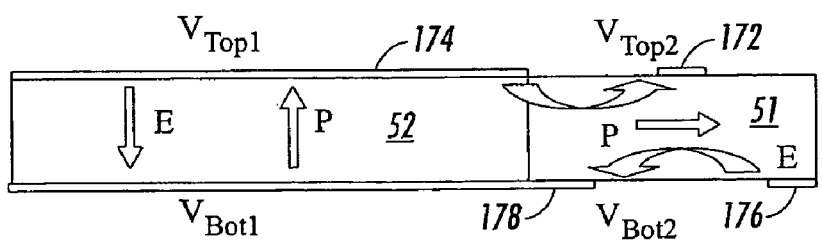
Figure 23D:
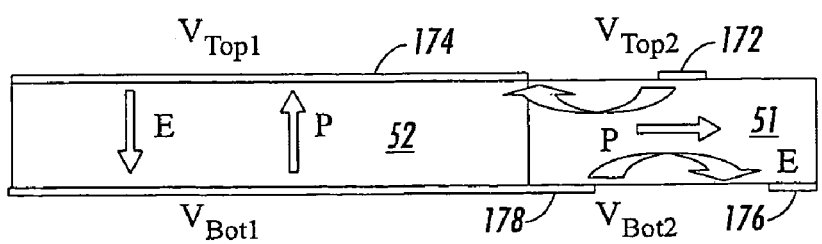

FIG. 23B shows the application of the E-fields which cause a contraction of both the top and bottom of the piezoelectric. This situation is depicted by showing the arrows extending from electrodes 172 and 176. FIG. 23C illustrates an embodiment where electrode 172 has an E-field applied to cause a top expansion of the piezoelectric, whereas the application of an E-field to electrode 176 causes a bottom piezoelectric contraction. Lastly, in FIG. 23D, the E-field is applied to electrode 172 to cause a top portion piezoelectric contraction, whereas the application of the E-field to bottom electrode 176 causes a bottom portion piezoelectric expansion.

Figure 24:
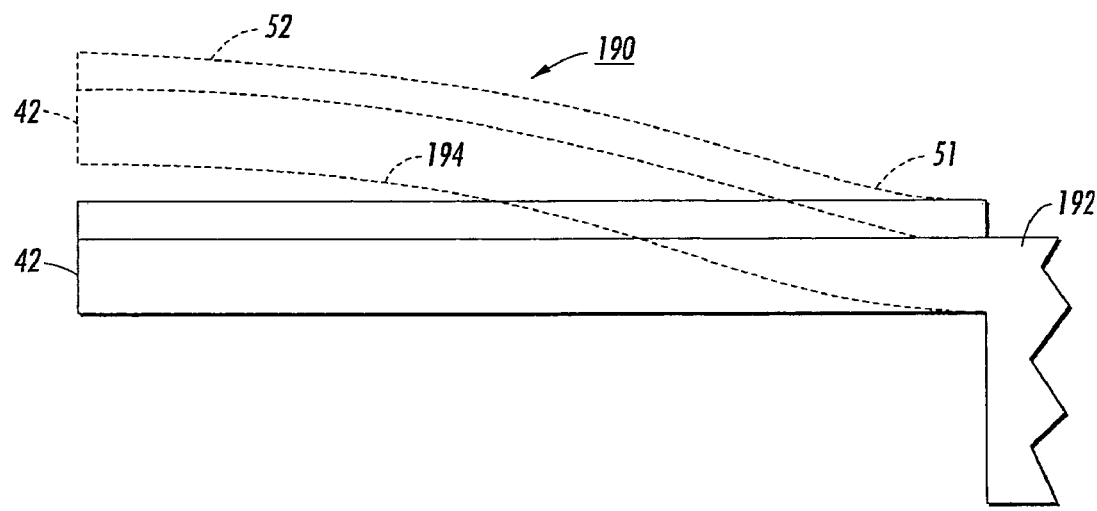
FIG. 24 is a partial side view of a diaphragm displacement for option 22A above.

Turning to FIG. 24, shown is a partial diaphragm structure 190 attached to an anchor portion 192. In a first state, the diaphragm structure is shown having no voltages applied and is, therefore, in substantially a planar position. However, upon application of the voltages such as in FIG. 23B, the combination of those voltages provide a deflection of the diaphragm 42 where the center 194 is bending into a spherical shape (i.e., concave downward, which occurs when the diaphragm 42 is deflected upward). At the same time, the annular ring 51 is bending into a cylindrical shape which smoothly joins to the disc 52. The bending in the center 194 in this situation is caused when the piezoelectric expands in the plane of the diaphragm 42, which it does when the electric field is applied in the opposite direction as the poling vector. The outer edge (annular ring) 51 in this case tends to curl into a cylinder from which best joins to the center 194 when the piezoelectric in this region is contracting. The voltage applied to the annular rings result in an electric field which is mostly anti-parallel to the poling vector.

Figure 25:
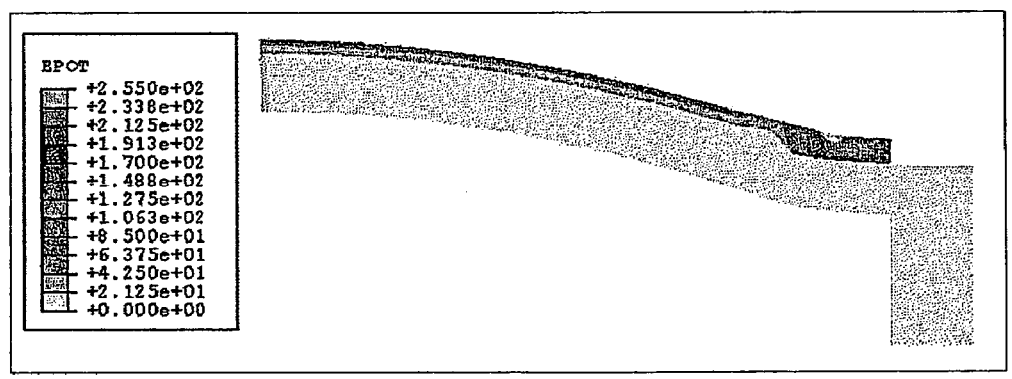
FIG. 25 is an alternative view of FIG. 24 showing the voltage penetration into the piezoelectric.

The partial view of FIG. 24 is also shown graphically in FIG. 25 which emphasizes where the voltage penetrates into the piezoelectric, and that the largest voltage penetration is at the annular ring.

Figure 26:
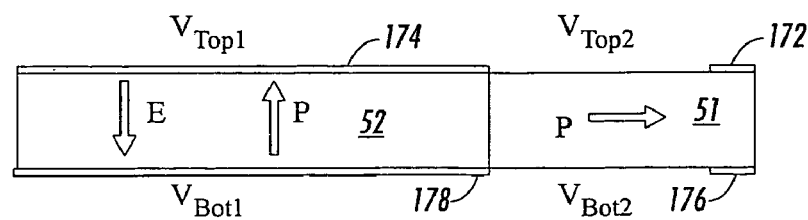
FIG. 26 illustrates the poling directions of the disc and annular ring, as well as the E-field direction of the disc in preparation for the various options of voltage applications to the annular ring such as in FIG. 23.

Turning to FIG. 26, set forth is an outer edge electrode diaphragm displacement design where the disc is operated in the $d_{31}$ mode and the annular ring in the $d_{33}$ mode. The annular rings electrodes 172, 176 are even, as opposed to a staggered design. As previously described and as again shown in FIG. 26, disc 52 of the piezoelectric is poled in the Z-axis, with the electric field (E) applied in an opposite direction. The annular ring 51 has the piezoelectric poled in a radial direction (R) in plane with the material. Thereafter, the various options of voltage application shown in FIGS. 23A-23D are applied to the electrodes.

In connection with the designs of FIGS. 23A-23D and 26, it was determined, by simulation, that the embodiment resulting in the highest usable deflection was provided by the top contraction, bottom contraction for the non-staggered design of FIG. 26. The generated values for this option are set forth in the third section of the following TABLE 4, which also lists results for a structure such as shown in FIGS. 23A-23D, employing the staggered electrode design. The top contraction and bottom contraction combination of the even electrode design results in the second greatest deflection (i.e., 566.31 $U_{max}$) for the even electrodes, causing a volume displacement ($\Delta V$) of 190.45 pL. This deflection was obtained by applying 60 volts to electrode 64, 285 volts to electrode 62, grounding (0 volts) electrode 68, and the application of 225 volts to electrode 66. It may be noted that the scenario of applying voltage so as to expand the top and contract the bottom of piezoelectric provides a greater volume displacement (212.81 pL). However, the intent of the present deflection scenarios are to apply a voltage such that the field strength in the material is maximized, but where the voltage does not approach the coercive field for the piezoelectric material at any point.

The simulations undertaken for the present embodiments were targeted to achieve peak fields of 3 volts per micron as a practical value. With regard to the top expand, bottom contract option for the even electrode design, however, this option was simulated with a voltage which exceeded the coercive field in the piezoelectric between the top and bottom outer electrodes and therefore would be undesirable. Also, while the obtained values for the staggered design in the first section of TABLE 4 are greater (i.e., 626.67; 624.56) than the non-staggered design, the staggered design may not be as desirable as the non-staggered design due to manufacturing issues and the ability to pole properly.

TABLE 4 further provides results of simulations for an outer edge electrode (OEE) (annular ring electrode) where the annular rings are equal to each other with a 450 micron radius and have a width of 40 μm.

As may also be determined by a review of TABLE 4, the simulation to generate this table defined the diaphragm radius ($r_{diap}$) as being 0.5 mm, the radius of the piezoelectric ($r_{PZT}$) at 0.5 mm, the thickness of the PZT ($t_{PZT}$) at 20 μm, the thickness of the diaphragm ($t_{diap}$) at 38 μm and the applied electric field (E) at about 3 V/μm.

TABLE 4

Comparative PZT Displacements
$r_{diap} = 0.5$ mm, $r_{PZT} = 0.5$ mm, $t_{PZT} = 20$ μm, $t_{diap} = 38$ μm, $E \approx 3$ V/μm

| PZT | Cases | $U_{max}$ (nm) | $\Delta V$ (pL) | $V_{t1}$ (V) | $V_{t2}$ (V) | $V_{b1}$ (V) | $V_{b2}$ (V) |
|---|---|---|---|---|---|---|---|
| OEE Stagger Elect | Top expand Bottom expand | 125.40 | 53.50 | 60 | −135 | 0 | −225 |
| | Top expand Bottom expand | 125.40 | 53.50 | 60 | −135 | 0 | −225 |
| | Top contract Bottom contract | 626.67 | 195.42 | 60 | 255 | 0 | 225 |
| | Top expand Bottom contract | 624.56 | 218.62 | 60 | −135 | 0 | 225 |
| | Top contract Bottom expand | 127.51 | 30.30 | 60 | 255 | 0 | −225 |
| OEE Even Elect 450 w = 40 μm | Top expand Bottom expand | 158.20 | 66.67 | 60 | −60 | 0 | −60 |
| | Top contract Bottom contract | 400.23 | 147.81 | 60 | 180 | 0 | 60 |
| | Top expand Bottom contract | 421.63 | 157.16 | 60 | −60 | 0 | 60 |
| | Top expand Bottom expand | 136.80 | 57.32 | 60 | 180 | 0 | −60 |

TABLE 4-continued

Comparative PZT Displacements
$r_{diap} = 0.5$ mm, $r_{PZT} = 0.5$ mm, $t_{PZT} = 20$ μm, $t_{diap} = 38$ μm, $E \approx 3$ V/μm

| PZT | Cases | $U_{max}$ (nm) | ΔV (pL) | $V_{t1}$ (V) | $V_{t2}$ (V) | $V_{b1}$ (V) | $V_{b2}$ (V) |
|---|---|---|---|---|---|---|---|
| OEE Even Elect 415 w = 75 μm | Top expand Bottom expand | 93.54 | 45.84 | 60 | −165 | 0 | −225 |
| | Top contract Bottom contract | 566.31 | 190.45 | 60 | 285 | 0 | 225 |
| | Top expand Bottom contract | 596.15 | 212.81 | 60 | −165 | 0 | 225 |
| | Top contract Bottom expand | 63.69 | 23.48 | 60 | 285 | 0 | −225 |

Figure 27:
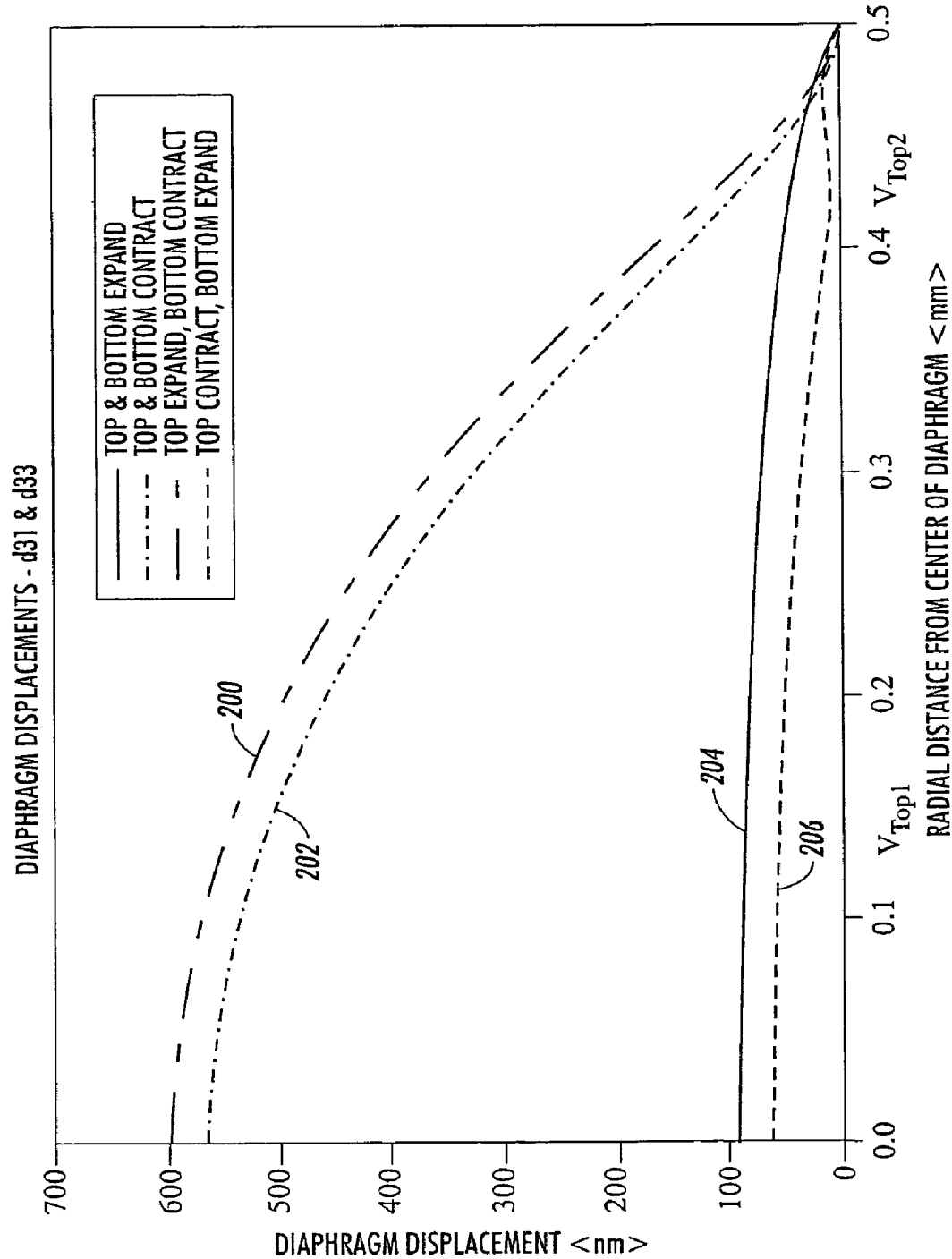
FIG. 27 presents a set of curves illustrating various applications of voltages to the outer electrodes of the annular ring.

In FIG. 27, curves 200-206 correspond to top and bottom expansion options which were previously discussed in connection with the electrode design of FIG. 26, and whose values correspond to the third section of TABLE 4. As noted here, curve 200 represents an option where the application of voltages to the annular electrodes causes top expansion and bottom contraction of the piezoelectric. This results in the largest deflection curve, whereas the remaining curves 202-206 show lesser degrees of deflection for their specific application of voltages of the annular ring electrodes.

Thus, disclosed is a radial poling and application of electric fields to generate a $d_{33}$ mode of operation for annular rings, in combination with operation of a disc in a $d_{31}$ mode. The electrodes on the annular ring are positioned in relationship to each other as in an even or staggered arrangement. Typical values for bulk ceramic piezoelectric using $d_{33}$ mode are approximately 500 pM per volt, and typical values for bulk ceramic piezoelectric using $d_{31}$ mode are approximately—200 pM per volt. An aspect of the present concepts as directed to drop ejection, is an optimized usage for multi-sized droplet ejection, which may be achieved by selective application of voltages to the disc and the annular ring electrodes in alternative combinations to give variable-sized droplets.

Figure 28:
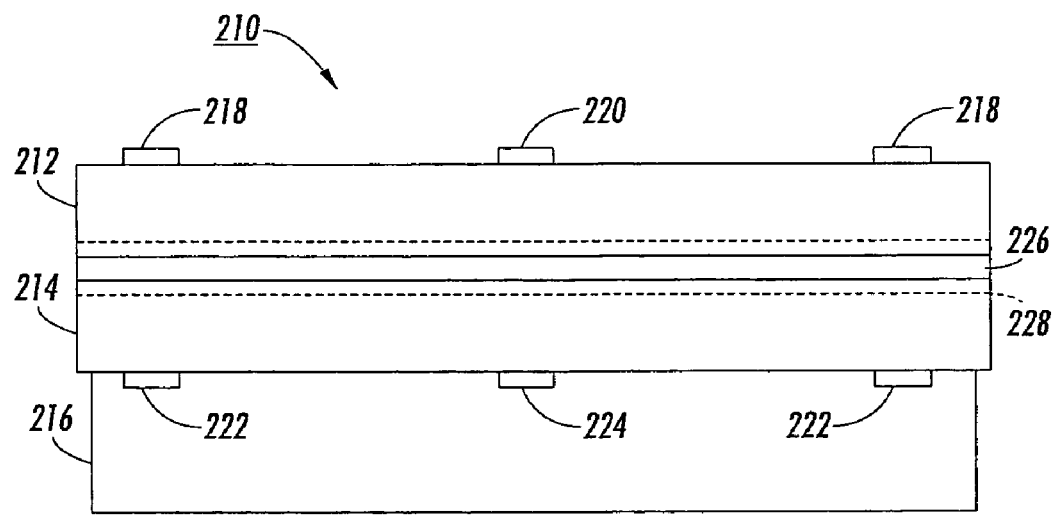
FIG. 28 depicts a bimorph structure which may be used in accordance with the present application.

The foregoing discussion has primarily focused on unimorph diaphragm structures. As defined herein, a unimorph diaphragm is one with a single piezoelectric. It is to be appreciated, the concepts of the present application may also be used in connection with a bimorph diaphragm structure 210, such as illustrated in FIG. 28. In this design, instead of a single piezoelectric, two piezoelectrics 212, 214 are used to actuate diaphragm 216. Piezoelectric 212 is provided with energy via electrodes 218 and 220. Whereas piezoelectric 214 is supplied with energy via electrodes 222 and 224. In this figure, electrodes 222 and 224 are shown on a bottom surface of piezoelectric 214. It is to be understood that this is simply one embodiment, and these electrodes may be on a top surface as in other designs. The bimorph piezoelectric elements 212, 214 may also be designed with each piezoelectric elements 212 and 214 having electrodes on both upper and bottom surfaces. The piezoelectrics may be connected to each other by an adhesive interface 226. However, alternatively, and as shown by the dotted line, an inert conductive centerplate 228 may be provided to isolate the two piezoelectric structures from each other. In one embodiment, the centerplate may be a stainless steel plate. Piezoelectrics 212, 214 may be configured as discs, annular rings, or a combination thereof, as disclosed in the preceding discussion.

In the described structures, maximum deflection of the diaphragm occurs, since the contraction and expansion of the piezoelectric material is matched to the two natural bending regions of the diaphragm. Contraction is initiated when it is desired to have a concave-up bending. An expansion of the piezoelectric material is used when it is desired to have a concave-down bending (given that the piezoelectric material is on top of the diaphragm). The overall stiffness pressure per volume displaced ($1/C_p$) is maintained and even improved over conventional single electrode construction, and the voltage requirements for actuation are decreased. Stated alternatively, the volume displaced per unit volt applied ($C_v$) is increased.

The diaphragm structures described in the preceding paragraphs may be employed as components in larger devices. In these situations, overtime, poling intensity may diminish, causing a poling drift which will result in a degradation of the larger devices' operational capabilities. This poling drift may occur with any piezoelectric material, but it is known to be especially detrimental when high response piezoelectrics are used.

To address this situation, described below are system designs, circuitry and poling methodology which permit the poling of the piezoelectric while incorporated into the larger device. This poling may be the original poling of the piezoelectric or may be undertaken as a re-poling of the piezoelectric. Thus, the use of the following system, circuit and methods permit for in-situ poling and re-poling of the piezoelectric used in the diaphragm structures described, as well as other known piezoelectric structures. For example, existing diaphragm structures which implement a single piezoelectric with a single voltage to cause actuation, may take advantage of the following described systems, circuit and methods.

Figure 29:
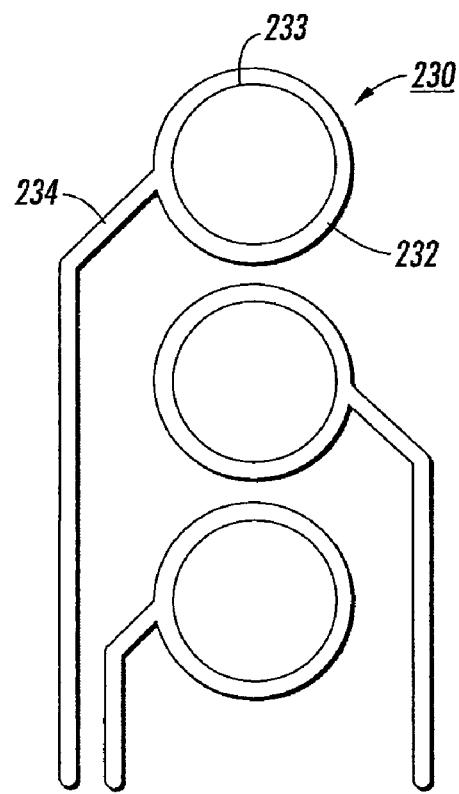
FIG. 29 shows a bottom metal electrode and conductor configuration.
Figure 30:
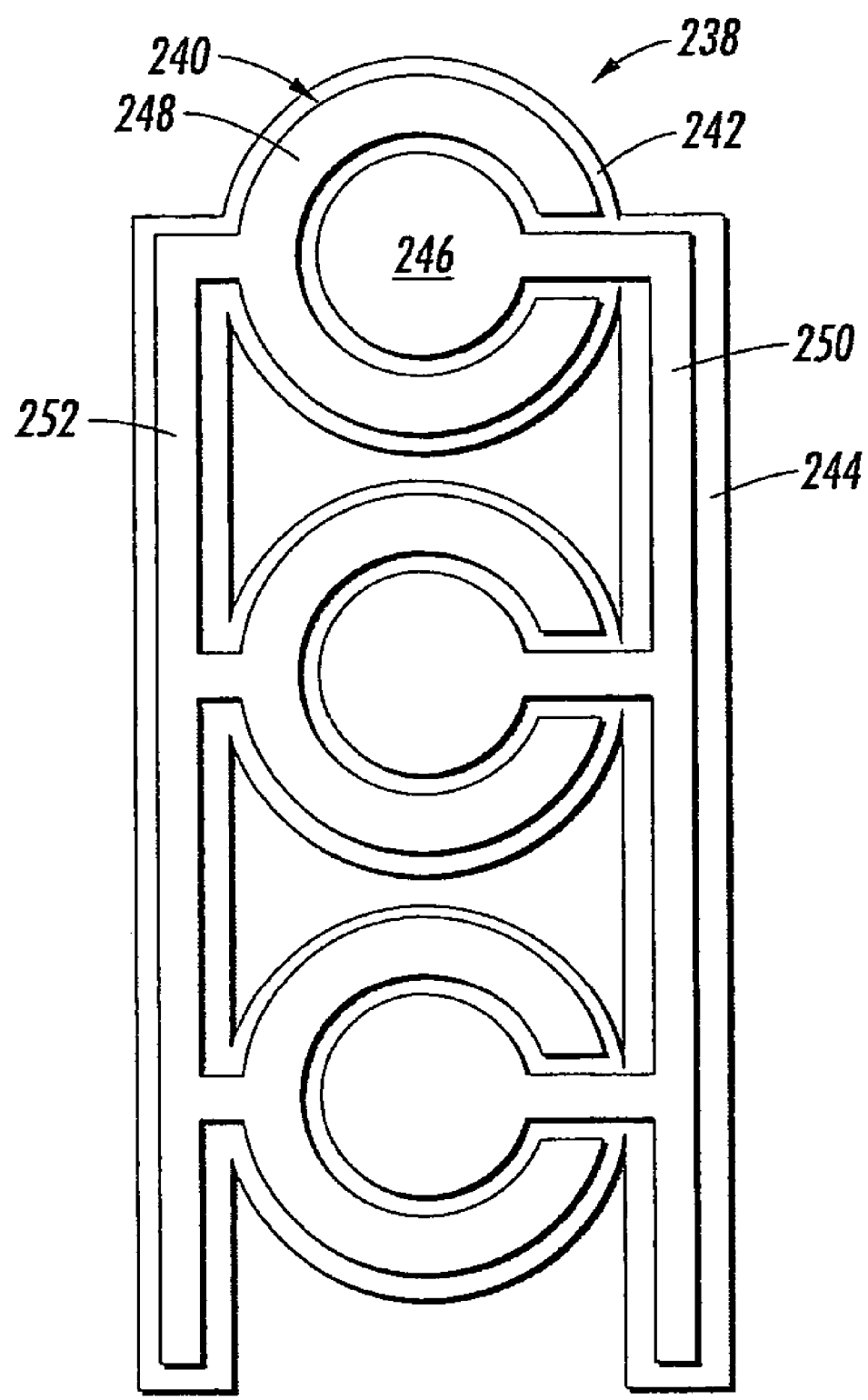
FIG. 30 is a top view of piezoelectric island and interconnect, carrying a top side electrode and conductor configuration.

Turning to FIGS. 29 and 30, the physical structure for the elements of this system are depicted in partial views. FIG. 29 shows a bottom side or lower electrode configuration 230 comprised of electrodes 232 (electrodes 233 will be discussed in connection with FIGS. 35A-37) and conductors 234. Bottom side electrode configuration 230 is located on a surface of the device, such as a printhead, to which islands of piezoelectric are to be attached. Turning to FIG. 30, a piezoelectric structure 238 carries a top side or upper electrode configuration 240. The piezoelectric configuration 238 includes a plurality of piezoelectric islands 242. The islands are constructed in a way such that there are bridges or interconnects 244 which run down the length of the column. In this design, the upper side electrode configuration 240 is designed to have an inner disc electrode 246 and an annular ring electrode 248. A conductor 250 connects each of the discs 246 in a column together, and a conductor 252 connects each of the annular rings of a column together. The upper side interconnect 240 is located on piezoelectric configuration 238, such that the electrodes 246, 248 and conductors 250, 252 do not extend over the edges of islands 242 and interconnects 244 of piezoelectric structure 238. In full construction, the bottom electrode 230 of FIG. 29 will be located on the opposite side of piezoelectric structure 238, which carries the top electrode configuration 240. Building top electrode configuration 240 to only be on the top surface of the piezoelectric, and not attempting to step it over the edge of the piezoelectric, allows for the routing of top metal electrode configuration 240 over the bottom electrode configuration 230. The piezoelectric, in this design, is used as an insulator between these two metal conductors, as the piezoelectric is a dielectric which is substantially non-conducting.

Figure 31:
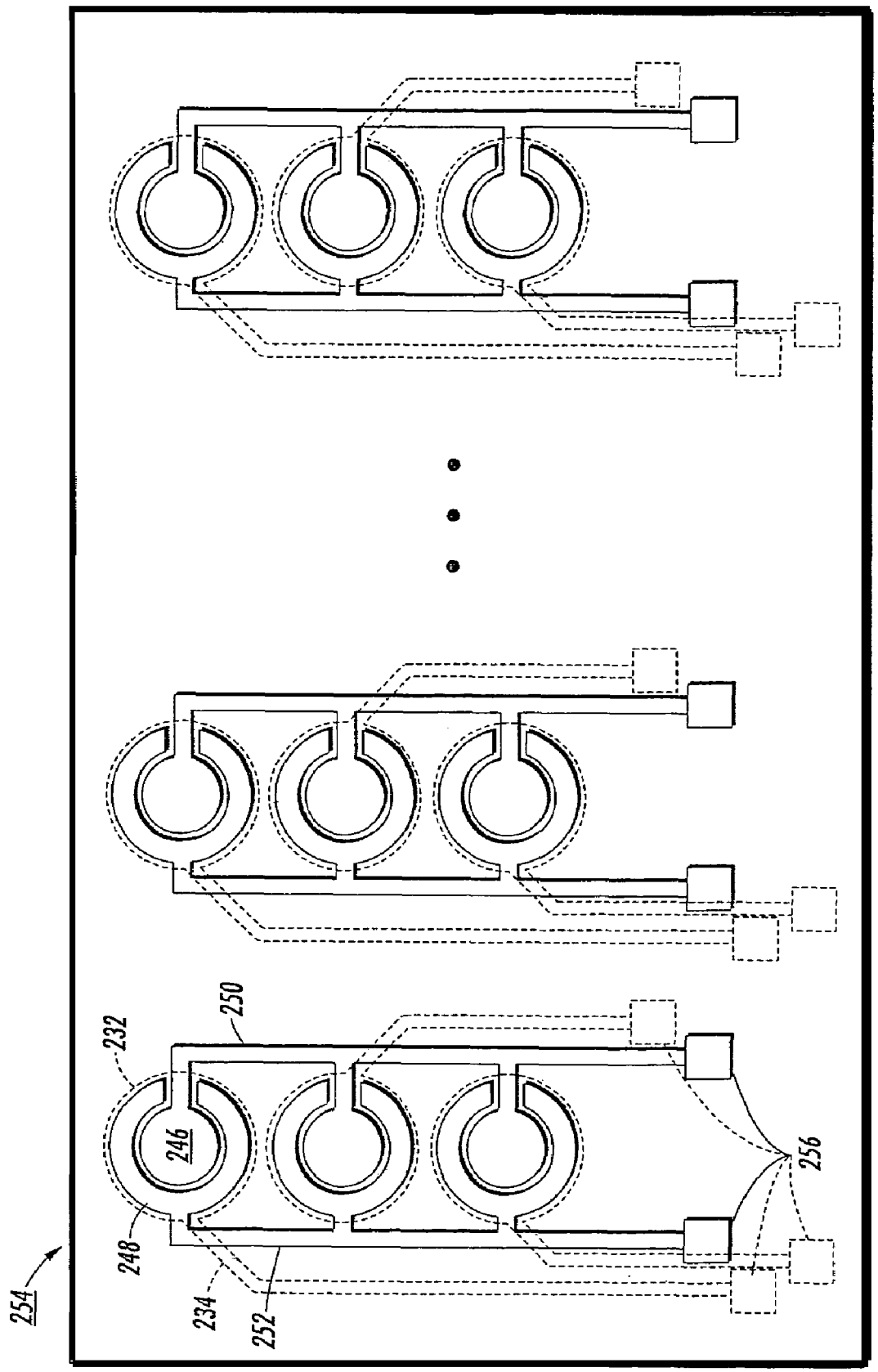
FIG. 31 shows the components of FIGS. 29 and 30 carried on a printhead.

Turning to FIG. 31, depicted is a printhead 254 which implement the elements of FIGS. 29 and 30 in a two-dimensional array of ejector columns and rows. Conductors 234, 250 and 252 are routed out to the edge of the two-dimensional array for connection to external driving electronics, not shown. These connection lines or conductors may be connected to the driving electronics via connectors 256. It is to be appreciated that connectors 256 are shown in a generalized manner as bonding pads, and any of a number of known connection techniques may be utilized, such as wire bonding, bump soldering, TAB among others. Additionally, in FIG. 31, while the conductors 234, 250 and 252 are shown connected to connectors 256 at the bottom of the printhead, if appropriate, connections may be made from all four sides of the printhead.

Figure 32:
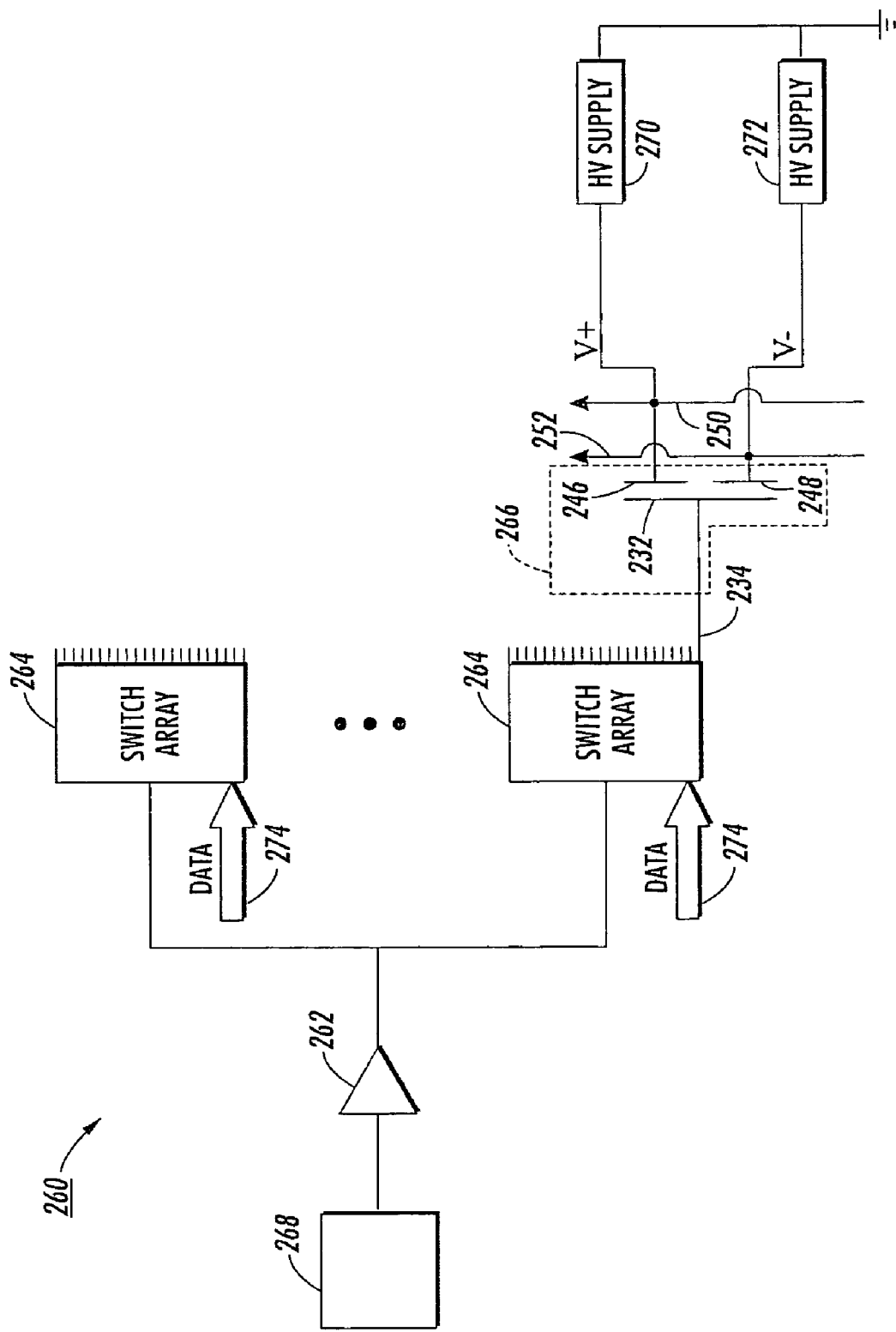
FIG. 32 is a drive circuit which permits poling and drop ejection operations.

Turning to FIG. 32, illustrated is a partial switching circuit 260, which may be formed using conventional electrical fabrication techniques and is used to control actuation of diaphragm structures, such as those of FIG. 31. Switching circuit 260 may include a pulse amplifier 262, which supplies signal to switching array chips 264 used to control application of power to diaphragm structures 266. In this design, conductor 250 is connected to disc electrode 246, and conductor 252 is connected to annular ring electrode 248. Bottom electrode 232 is on an opposite side of a piezoelectric such as 242 (of FIG. 30) and is connected to the switching array 264 via the conductor 234. Disc conductor 250 connects to each of the discs 246, and annular ring conductor 252 connects to each annular ring 248 of a column as shown in FIGS. 29-31. Voltage supply 268 supplies signals to pulse amplifier 262 during normal drop ejection operation of this circuit. However, during the poling operation, as pulse amplifier 262 is set to zero volts, voltage supply 268 is essentially out of the circuit. A high voltage supply 270 supplies power to disc electrode 246, and power supply 272 supplies power to annular ring electrode 248.

The voltages required for poling are substantially higher than the pulse voltages used for printing (about 10-100 volts) and are limited in most applications by arcing problems on the face of the printhead. These high voltages imply a rather high cost per switch if a switch were provided in each line to an ejector. Also, the switches used to set the data to the printer array are limited in voltage capacity. Knowing these limitations, the circuit of FIG. 32 may be used to generate a poling cycle in the following sequence.

In a first step, with the system in an on state and the software set to begin poling operation, all of the data inputs 274 are set to a closed state, and the pulse amplifier 262 is set to zero (0) volts. In this state, the data switches are self-protecting against high voltages, since the current flowing during the poling cycle is low and the switches are able to sink this low current into the virtual ground of pulse amplifier 262. Next, the high voltage power supplies 270, 272 are turned on and ramped up to a desired voltage for a set period of time required for a particular poling operation. For example, this set time period may be between 1 and 30 minutes, and preferably 15 minutes in many implementations. Should arcing between points on a surface of the printhead between the two high voltages becomes an issue, then the power supplies are turned on one at a time, and the poling undertaken in two separate phases. The poling arrangement shown in FIG. 32, with the high voltage supply 270 set at a positive voltage, and the high voltage power supply 272 set at a negative voltage will result in distinct poling results. For example, the disc may be poled in the conventional right-hand coordinate system in a Z-axis direction (i.e., for operation in a $d_{31}$ mode), whereas the annular ring portion of the piezoelectric may be poled using a cylindrical coordinate system, in a radial (R) direction of the piezoelectric material (i.e., for operation in a $d_{33}$ mode).

Next, the high voltage power supplies 270, 272 are then ramped down and turned off. The normal function of pulse amplifier 262 and the switch arrays 264 to emitting fluid drops is then restored.

The impedance of the high voltage supplies, when off or at 0 volts, would be at a low value (roughly less than 0.2 ohms). If required, a mechanical relay may be used to short the common point to ground.

By the design shown in FIGS. 29-32, an in-situ poling or re-poling of piezoelectric is achieved. This design, also makes it possible to use the circuit of FIG. 32 to perform both the poling/re-poling operations and then return to a normal function of operation for emitting selected droplets to form a desired pattern.

Figure 33:
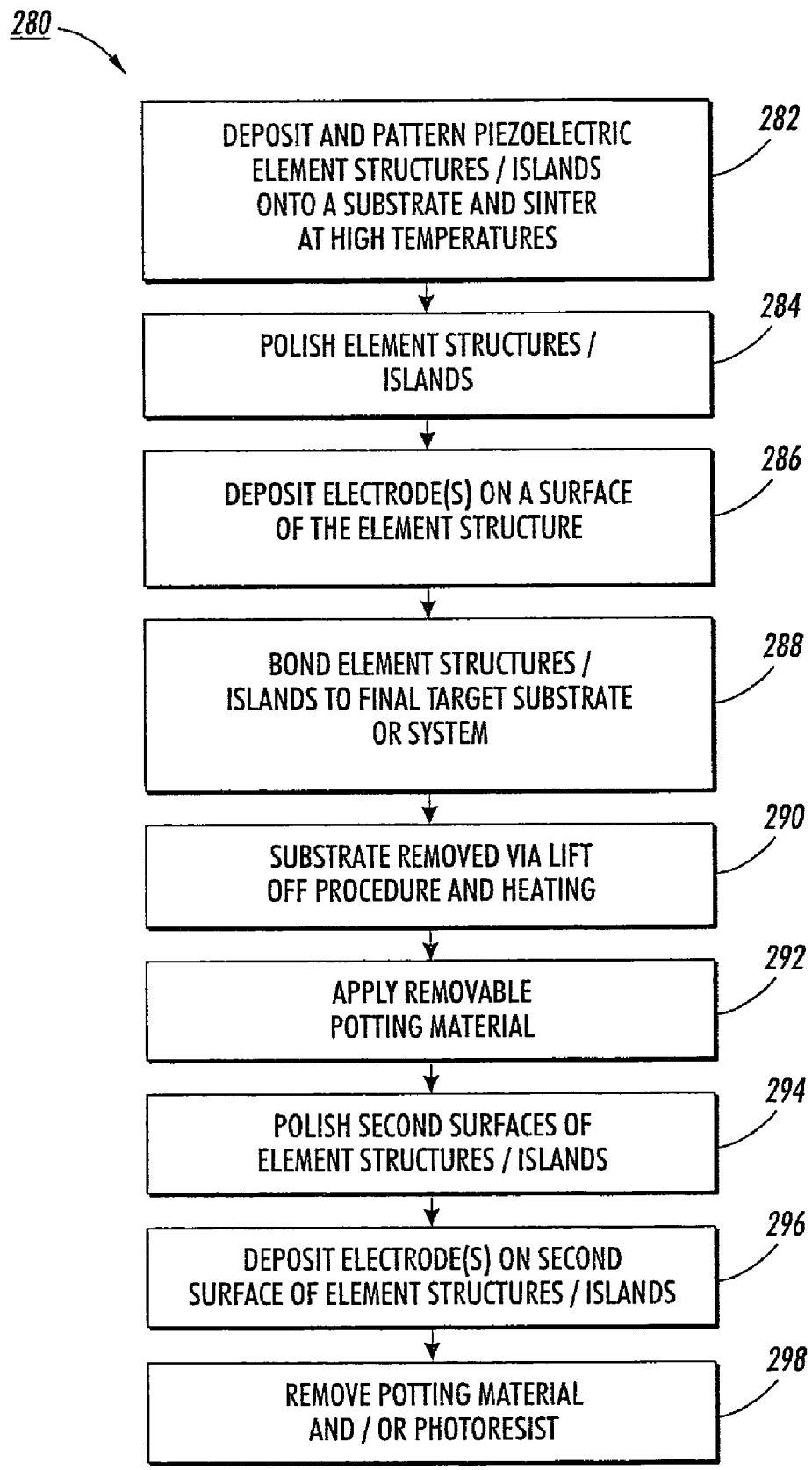
FIG. 33 is a high level process flow for piezoelectric element production and direct bonding to a final target substrate or system.

The described system may be fabricated using a number of manufacturing processes. FIG. 33 illustrates a high level process flow 280 showing a processing operation for the manufacture and attachment of the piezoelectric element.

Initially, an array of piezoelectric islands, having the mentioned interconnects, are fabricated by depositing piezoelectric islands onto an appropriate substrate by use of a direct marking technology 282. Preferably the substrate is made of sapphire, or other appropriate material. In the deposition techniques employed, ceramic type powders are used in a preferred embodiment. The fabrication process includes sintering the material preferably at a temperature of approximately 1000° to 1350° C. for densification, although other temperature ranges may also be used in appropriate circumstances. Following the fabrication process the surface of the formed structures of piezoelectric islands are polished 284, preferably using a dry tape polishing technique. Once the piezoelectric islands have been polished and cleaned, electrodes 233 as shown in FIG. 29 are deposited on the polished surface of the piezoelectric islands 286. It should be noted that this bottom metallization is designed to be in intimate contact with the piezoelectric. This is the reason it is deposited first, prior to the piezoelectric being attached to the contacting metal on the printhead. The metal on the printhead surface may not otherwise achieve sufficient contact to the piezoelectric. The formation of the electrodes may also or alternatively include known lithographic and/or etching techniques in order to obtain the desired electrode configurations. Next, the surface of the piezoelectric islands with the electrodes are permanently bonded to a final target 288, such as to a substrate or as part of a larger system. Such substrate may have conductors such as in FIG. 29, which make electrical contact to the piezoelectric electrodes 233, as will be shown in more detail in FIGS. 36A-38B. When used as an ejector, the larger system may be a printhead. It is noted that this operation completes the contact to the metal for the bottom interconnection 230 (of FIG. 29) of the piezoelectric. Typically, the composition of the piezoelectric is doped or undoped piezoelectric, but any piezoelectric material, such as lead titanate, lead zirconate, lead magnesium titanate and its solid solutions with lead titanate, lead zinc titanate and its solid solutions with lead titanate, lithium niobate, lithium tantanate, and others may be used.

At this point, the substrate on which the piezoelectric islands were initially deposited is removed through a liftoff process 290 using radiation energy such as from a laser or other appropriate device. The releasing process involves exposure of the piezoelectric elements to a radiation source through the substrate, to break an attachment interface between the substrate and the piezoelectric elements. Additional heating is implemented, if necessary, to complete removal of the substrate. Once the liftoff process has been completed, a removable material is applied to fill in the areas between the piezoelectric islands attached to the printhead 292. Thereafter, top surfaces of the newly exposed piezoelectric islands are polished 294. Next, a second electrode configuration is deposited on a second surface of the piezoelectric material 296. This configuration may be in the form of electrodes 246, 248 and conductors 250, 252 of FIG. 30. The electrode configuration may be formed, including or alternately using lithographic patterning, etching, or via a laser liftoff process. Next excess potting material and/or photoresist is removed 298. At this point the device, such as a printhead, is ready for connection to an electric control circuit.

With attention to FIG. 34, which illustrates step 282 in greater detail, piezoelectric elements or islands 242 and interconnects 244 are deposited on an appropriate substrate 300, and then sintered at 1000° to 1350° C. for densification. The depositing step may be achieved by a number of direct marking processes including screen printing, jet printing, ballistic aerosol marking (BAM) or acoustic ejection, among others. Using these techniques permits flexibility as to the type of piezoelectric element configurations. For example, when the piezoelectric islands and interconnects may be made by screen printing, the screen printing mask (mesh) can be designed to have various shapes or openings resulting in a variety of shapes for the piezoelectric elements, such as rectangular, square, circular or rings, among others. Use of these direct marking techniques also permit generation of very fine patterns.

The substrate used in the processes of this application will have certain characteristics, due to the high temperatures involved and—as will be discussed in greater detail—the fact that the substrate is to be transparent for the liftoff process. Specifically, the substrate is to be transparent at the wavelengths of radiation beam emitted from the radiation source, and is to be inert at the sintering temperatures so as not to contaminate the piezoelectric materials. A particularly appropriate substrate is sapphire. Other potential substrate materials include transparent alumina ceramics, aluminum nitride, magnesium oxide, strontium titanate, quartz, among others. In one embodiment of the process, the substrate selected is transparent for a radiation source, such as an excimer laser operating at a wavelength of 308 nm, and does not have any requirement on its crystallographic orientation. It is preferable that the selected substrate material be reusable, which will provide an economic benefit to the process.

After fabrication of the piezoelectric islands and interconnects has been completed, the process moves to step 284, where the top surface of the piezoelectric islands and interconnects polished through a tape polishing process to remove any surface damage layer, such as due to lead deficiency. This step ensures the quality of the piezoelectric elements and homogenizes the thickness of piezoelectric elements. By having a homogenized thickness, each of the piezoelectric elements of an array will bond to the final target system or the transfer substrate even when a very thin epoxy bonding layer or a thin film intermetallic transient liquid phase bonding layer is used.

In one preferred embodiment, the tape polishing step is a dry tape polishing process that provides a planar flat polish out to the edge of the surfaces of the piezoelectric elements, which avoids a crowning effect on the individual elements. Compared to a wet polishing processes, the dry tape polishing does not cause wearing of the edges of the piezoelectric elements, making it possible to fabricate high-quality, thickness and shape-identical piezoelectric elements. Once polishing has been completed, the surface is cleaned, in one instance by application of a cleaning substance.

After polishing and cleaning, the process moves to step 286 where, as shown in FIG. 35A, metal electrodes and conductors (e.g., Cr/Ni), which may be in the form of electrodes 233 of FIG. 29, are deposited on the surface of the piezoelectric islands 242 and interconnects 244 by techniques such as sputtering or evaporation with a shadow mask. The electrodes and conductors can also be deposited by a direct marking method, such as screen printing, and sintered at suitable temperatures.

Alternatively, when using a thin film intermetallic transient liquid phase bonding process, certain low/high melting-point metal thin film layers may be used as the electrodes for the piezoelectric islands, thus in some cases it is not necessary to deposit an extra electrode layer such as Cr/Ni. However, preferably the thin film intermetallic transient liquid phase bonding process is undertaken after metal electrode deposition, such as Cr/Ni deposition. This process is generally shown in FIG. 35B, where a thin film layer of high melting-point metal 302 (such as silver (Ag), gold (Au), Copper (Cu), Palladium (Pd)) and a thin film layer of low melting-point metal 304 (such as Indium (In), Tin (Sn)) may be deposited on the piezoelectric islands and interconnects and a thin layer of high melting-point metal (such as Ag, Au, Cu, Pd) may be deposited on the bonding substrate. These materials are then used to form a bond.

Figure 36A:
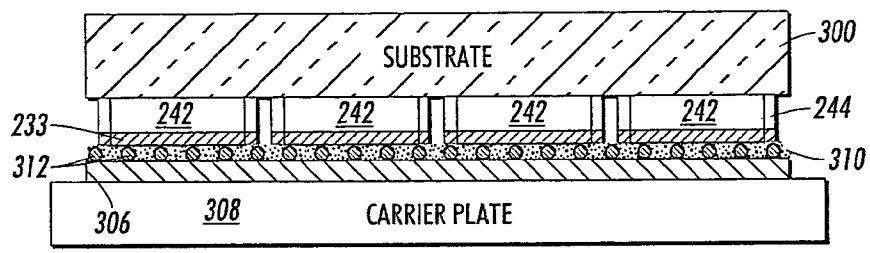
FIG. 36A illustrates an embodiment of a bonding of piezoelectric films to a final target which is conductive using a thin, nonconductive epoxy bonding containing sub-μm (micrometer) conductive balls.
Figure 36B:
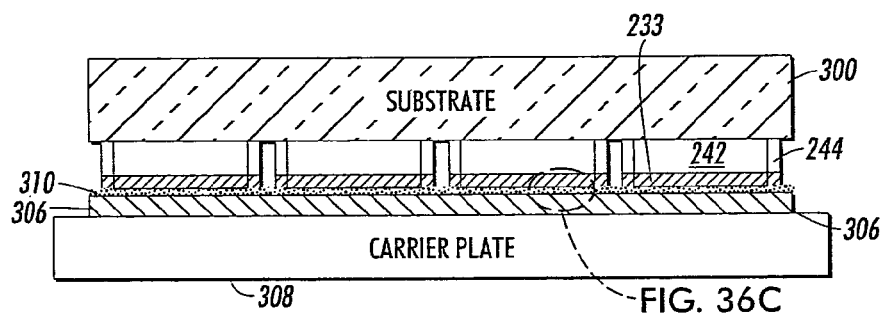
FIG. 36B shows a nonconductive epoxy bonding process.

Once the electrodes are formed, the piezoelectric islands are then bonded to the final target substrate or system (step 288 of FIG. 33). For example, as depicted in FIGS. 36A and 36B, the final target could be a metal foil (or the surface of a printhead) 306, which is put on a carrier plate 308 during the process. The bonding is accomplished by using a nonconductive epoxy layer 310 which can be as thin as less than 1 µm. The thin epoxy contains sub-µm conductive particles, which in one embodiment may be conductive balls (such as Au balls) 312 so the epoxy is conductive in the Z direction (the direction perpendicular to the surface of metal foil). Thus it can keep the electric contact between the surface electrode of the piezoelectric elements and the metal foil. The concentration of the conductive balls can be controlled in such a range that the cured thin epoxy is conductive in the Z direction but not conductive in the lateral directions, as done for anisotropic conductive films. The shrinkage of the epoxy maintains contact between the surfaces and the balls in the Z direction.

Figure 36C:
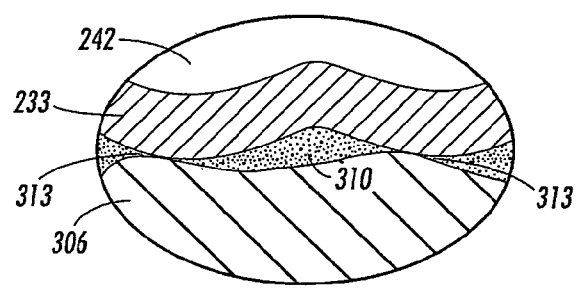
FIG. 36C is an enlarged view of a section of FIG. 36B.

In an alternative embodiment shown in FIGS. 36B and 36C, conductive balls 312 are removed, and bonding is accomplished using the nonconductive epoxy layer 310 alone. As shown in more detail by FIG. 36C, electrical contact is maintained via electrical contact points 313, formed when the surface of the electrode 233 and metal foil (or printhead) are moved into contact, with suitable surface roughness or asperity of the piezoelectric films and/or metal foil (printhead).

Figure 37:
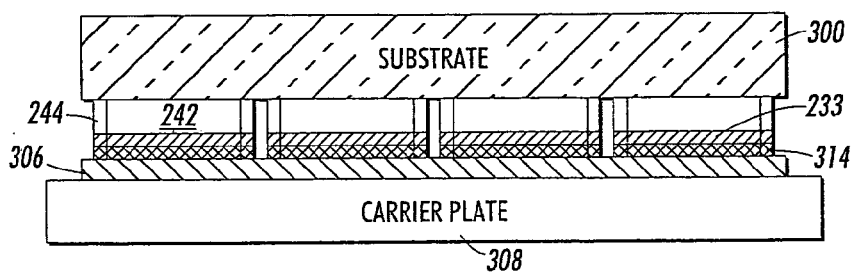
FIG. 37 illustrates a bonding of piezoelectric films to a final target using thin film intermetallic transient liquid phase bonding.

In an alternative embodiment, bonding to the final target (e.g., printhead) may be accomplished by using the previously mentioned thin film intermetallic transient liquid phase bonding, employing in one embodiment a high melting-point metal (such as Ag, Cu, Pd, Au, etc.)/low melting-point metal (such as In, Sn) intermetallic compound bonding layer or alloy 314, FIG. 37.

More particularly, for thin film intermetallic transient liquid phase metal bonding, a high melting-point metal thin layer, such as a Pd thin layer, is deposited on the target substrate or system. Next the piezoelectric configuration consisting of islands 242 and electrode 233 (patterned on the islands) is moved into contact with the Pd thin layer and heated under pressure above the melting point of the low melting-point metal, e.g., about 200° C. By this operation the high melting-point metal/low melting-point metal/high melting-point metal combination, such as Pd/In/Pd layer (a high melting-point metal/low melting-point metal such as Pd/In layer previously deposited on the piezoelectric islands 242 as shown in FIG. 35B) will form the high melting-point metal-low melting-point metal bonding layer compound or alloy 314. This compound or alloy may be a $PdIn_3$ alloy layer which is about 1 µm-thick, which acts to bond piezoelectric islands 242 and target substrate (i.e., printhead) 306. Functionally, the low melting-point metal diffuses into the high melting-point metal to form the compound/alloy.

As the melting point of the formed intermetallic compound phase can be much higher than that of the low melting-point metal, the working temperature of the bonding layer can be much higher than the temperature used to form the bonding. For example, when Indium (In) is used as the low melting-point metal and Palladium (Pd) is used as the high melting-point metal, the bonding can be finished below or at 200° C. as the melting point of In is about 156° C. However, the working temperature of the formed intermetallic compound bonding layer, $PdIn_3$, can be well above 200° C. because the melting point of $PdIn_3$ is about 664° C. The thickness of the bonding layer could be from 1 to 10 µm, but a thinner bonding layer (e.g., about 1 µm) is expected for this purpose. Further, the amount of high and low melting-point metals can be controlled so they will be totally consumed to form the intermetallic bonding layer.

Figure 38A:
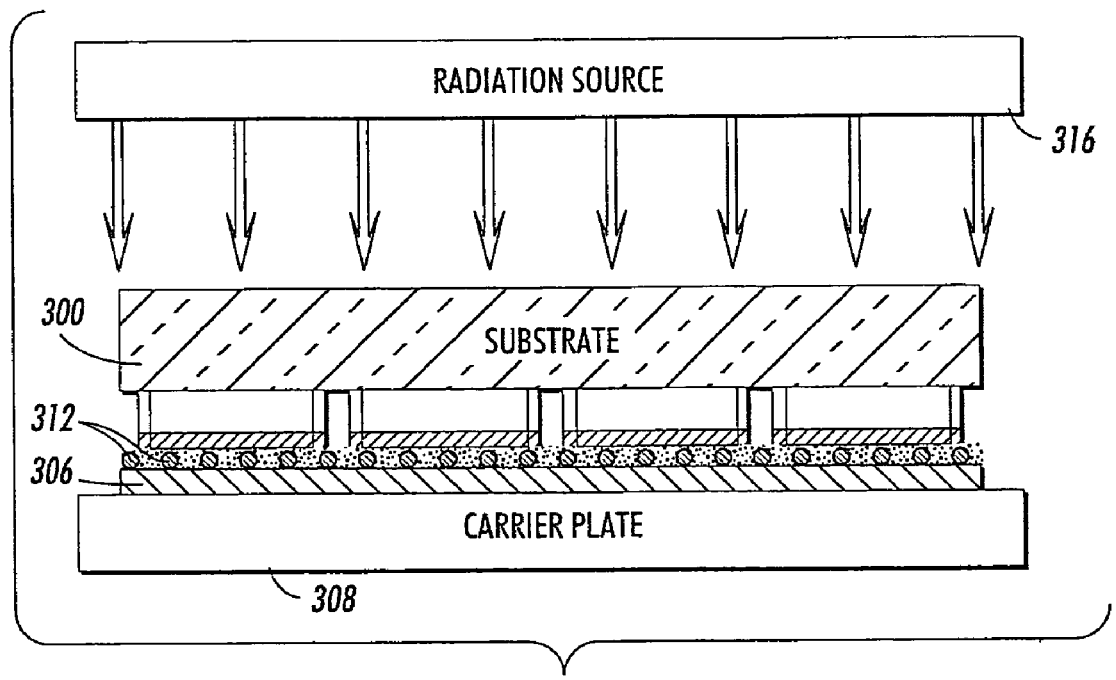
FIG. 38A illustrates radiation of a beam through the carrier substrate during a liftoff process.
Figure 38B:
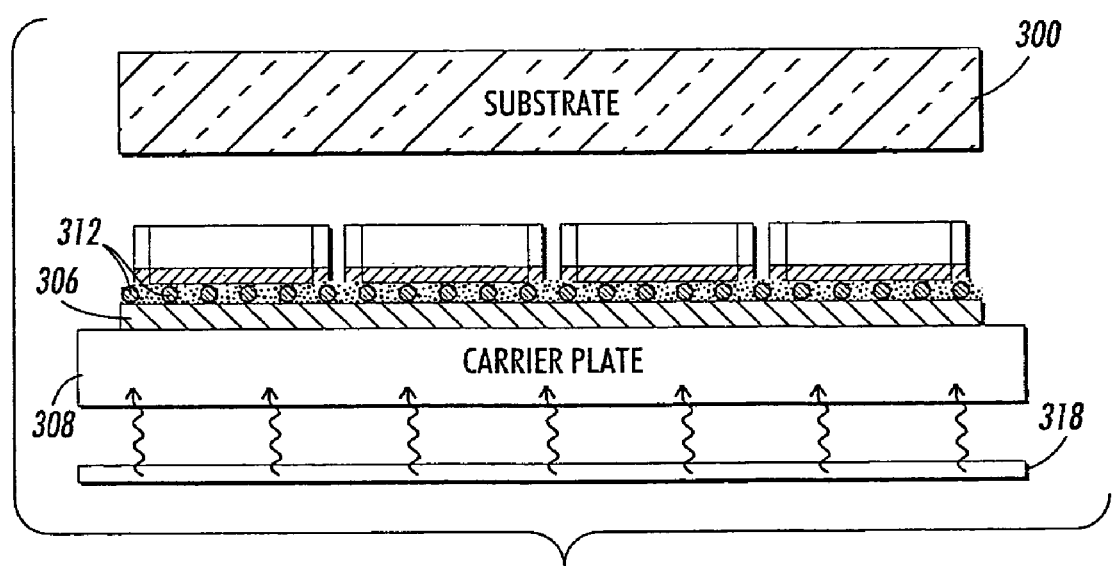
FIG. 38B depicts a heat transfer for the liftoff process.

The next step is to release the piezoelectric islands 242 and interconnects 244 from substrate 300. The releasing of substrate 300 may be accomplished by a liftoff operation as depicted in FIGS. 38A and 38B. The following description is based on the arrangement of FIG. 36A. However, it is equally applicable to all provided alternatives. Substrate 300 is first exposed to a radiation beam (such as a laser beam) from a radiation source (such as an excimer laser source) 316, having a wavelength at which the substrate 300 is substantially transparent. In this way a high percentage of the radiation beam passes through the substrate 300 to the interface of the substrate and islands 242 and interconnects 244 at the surface of the substrate. The energy at the interface acts to break down the physical attachment between these components. Following operation of the radiation exposure, and as shown in FIG. 38B, heat is applied by a heater 318. While the temperature provided by the heater will vary depending on the situation, in one embodiment a temperature of between 40 to 50° C. is sufficient to provide easy detachment of any remaining contacts to fully release the piezoelectric islands 242 and interconnects 244 from substrate 300. Desirably, the substrate is of a material that allows it to be re-used after a cleaning of its surface.

In one embodiment, the radiation source is an excimer laser source. The wavelength used in this situation is about 308 nm, and the piezoelectric material is polycrystalline and was screen printed on substrates and therefore more weakly bound to the substrate compared to the epitaxially grown single crystal films.

Exposure to the radiation source does raise the potential of damage to the surface of the piezoelectric elements, this potential damage should however be no more than to a thickness of about 0.1 µm. Since the thickness of the piezoelectric elements, in most embodiments, will be larger than 10 µm, the effect of the surface damage layer can be ignored. However, if otherwise necessary or when piezoelectric elements of less than 10 µm are formed by these processes, any surface damage layer can be removed by appropriate processes including ion milling or tape polishing. It is to be appreciated FIGS. 38A and 38B are simply used as examples, and the described liftoff process may take place using alternatively described arrangements. Also, for convenience, FIGS. 38A and 38B corresponds to the structure of FIG. 36A. However, the same types of procedures may be applied to other relevant arrangements in accord with the present teachings.

Figure 39A:
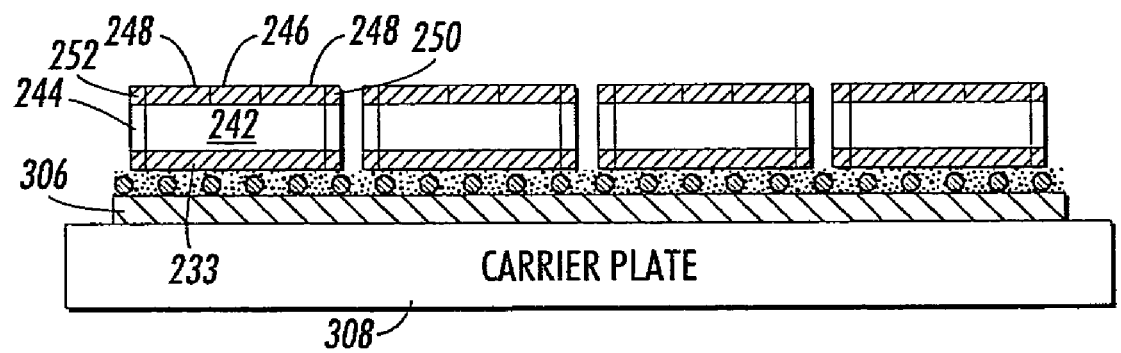
FIGS. 39A and 39B are alternative designs of bonding the thick film array to a final target substrate or system or to a transfer substrate, for poling operation.
Figure 39B:
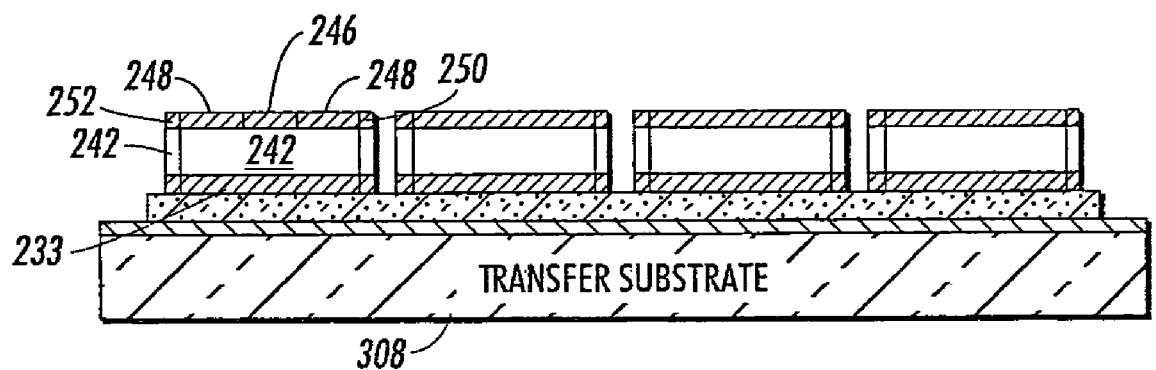

Next, and following the steps for adding potting material and polishing, as depicted in FIGS. 39A and 39B, second side surface electrodes and conductors, such as disc electrodes 246 and annular ring electrodes 248 and corresponding conductors 250, 252, are deposited on the released surfaces of islands 242 and interconnects 244 with a shadow mask or by other appropriate method in accordance with step 296 of FIG. 33.

For the case where a piezoelectric islands are already bonded to the final target substrate or system such as by the process of FIG. 33, the potting material and/or photoresist is removed and the process is complete. At this point, the printhead is now ready for attachment to an electrical circuit (i.e., via wire bonding, bump techniques or by other means). If the bump processing techniques are used, those appropriate manufacturing processes would be undertaken.

Figure 40:
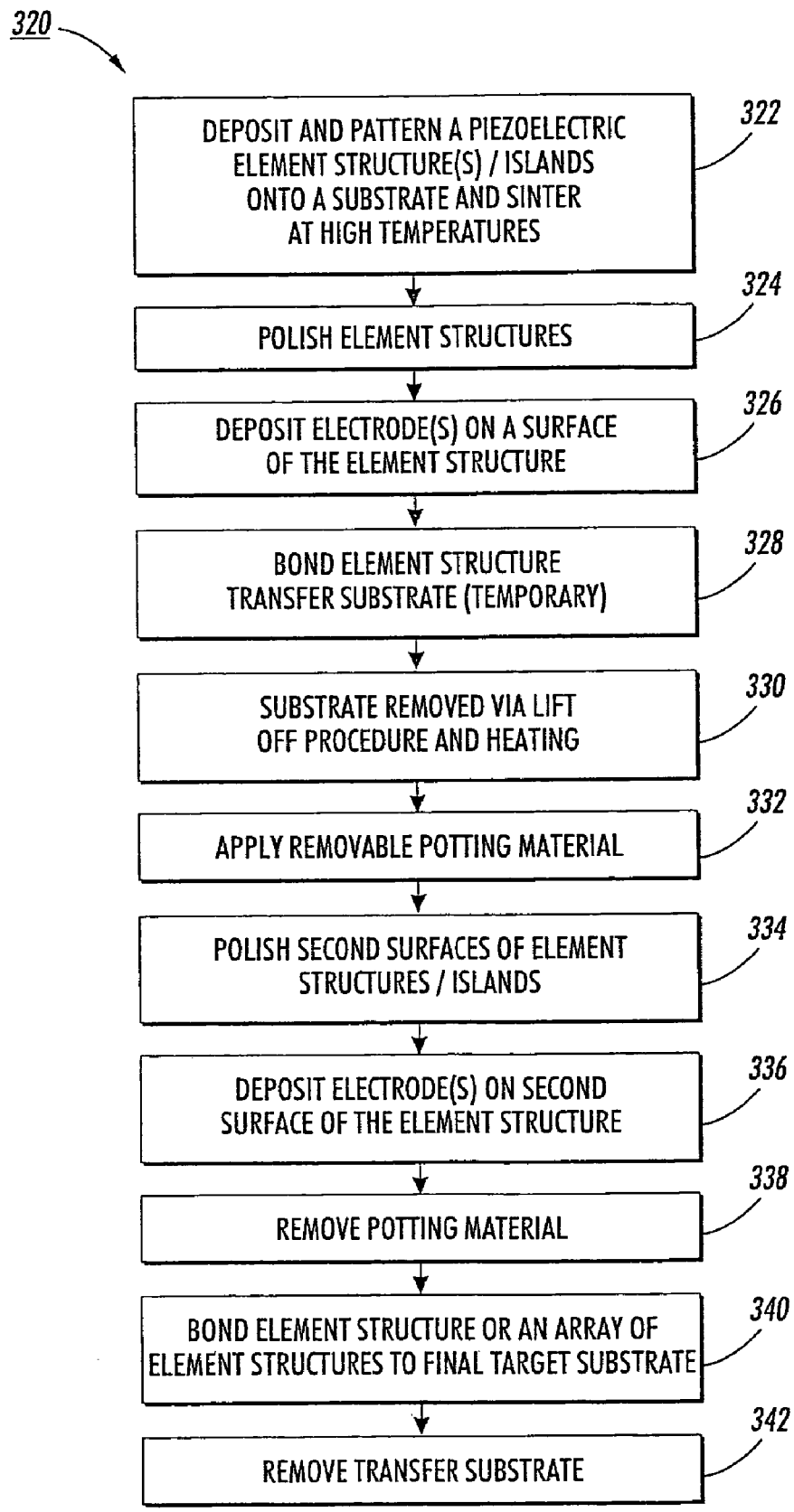
FIG. 40 is a high level process flow for piezoelectric element production including attachment of the piezoelectric elements to a transfer substrate prior to transfer to a final target substrate or system.

Turning to FIG. 40, illustrated is an alternative high-level process flow 320. This process differs from that of FIG. 33 in that the bonding is to a transfer substrate rather than to a final target substrate or system (e.g., the printhead). A benefit of bonding first to a transfer substrate is that it allows the structure to be tested prior to a permanent attachment to an expensive device. Thus, the fabrication step 322, the tape polishing step 324 and the electrode depositing step 326 are performed in the same manner as steps 282, 284 and 286 of FIG. 33. At bonding step 328, the bonding is to a transfer substrate, as this connection is not intended to be permanent. Thereafter, the liftoff step 330, the addition of potting material 332, the second polishing step 334, the second electrode deposition step 336 and the removal of the potting material 338, which correlate to steps 290-298 of FIG. 33, are performed.

The piezoelectric elements are then bonded to a final target substrate or system 340, in a procedure similar in design to step 288 of FIG. 33. Following bonding step 340, the transfer substrate is removed 342. When bonding to a final target substrate or system, a thin high strength bonding layer is used to minimize or avoid undesirable mechanical damping or energy absorption of the bonding layer. This bonding will, however, also permit maintaining of electrical contact between the metal electrodes on the piezoelectric elements and the final target substrate or system or a conductive surface of the final target substrate or system.

Employing the process of FIG. 40, the configured actuator may be poled and then tested, prior to the final bonding in step 340. In this way only fully operational devices will be bonded to final target substrates or systems, thus avoiding yield loss of the target substrates or systems.

Thus, the foregoing has described a system, circuit and method where an interconnect technique uses traces of metal which run on a top surface of the piezoelectric, together with traces which run under the piezoelectric to make a completed interconnection. This construction allows for crossovers where the bottom metal is overlayed with piezoelectric, and the top interconnect where needed. The overall circuit utilizes both sides of the piezoelectric actively and is constructed in a way to minimize costs. This design avoids building switches into the connections on the switch array side of the piezoelectric elements, and avoids keeping one surface of the piezoelectric connected constantly to ground.

The description of the dual-use switching circuit has been described in the FIGURES with reference to a single bottom electrode for each corresponding piezoelectric island, and two electrodes in the form of a disc and annular ring on a top surface of each piezoelectric island. It is again to be appreciated that the present design may be used where only a single electrode is used on a top surface. Further, the described system may be used where multiple electrodes (more than two) are located on both the top and bottom surfaces of the piezoelectric islands. In situations where multiple electrodes are employed on each surface of the piezoelectric islands, to avoid undesirable crossover additional steps to isolate the conductors of the additional electrodes may be required. In one instance, this isolation may be achieved by etching a small channel or depression into the piezoelectric material itself, or into a substrate which may carry the electrodes. Thereafter a conductor for one of the electrodes is deposited, and the channel is covered with an oxide or other insulating material which would permit a further conductor to pass over the lower covered conductor.

This arrangement permits for the poling and in-situ re-poling of the piezoelectric material as needed to maintain performance over the life of the larger device, such as a printer. Particularly, present day printers may suffer a droop in poling magnitude of up to ten percent over the life of the product, and some degree of nonuniformity of printing results will occur. It is expected the piezoelectric in a device as described herein may be in the 20 to 30 micron range compared to the existing 100 micron range in use today. This thinner material, if not repoled when necessary, will cause even larger droop rates. It is to be understood the re-poling operation may be undertaken at preset time intervals as coded by software. Alternatively, a user may institute re-poling by depressing a button provided on a machine for that purpose.

As previously noted, while this present discussion shows the interconnections running out of a single edge, i.e., the bottom, it is possible for the interconnections to be designed for connection at both the top and bottom, or even at all four sides of a printhead. An alternative to running the interconnections to the outer edges of the printhead is for the top metallization layer to directly bond this material to the surface using a two-dimensional array technique, such as ball grid arrays or silver paste bumps to a flex circuit.

While the exemplary embodiment has been described with respect to specific embodiments by way of illustration, many modifications and changes will occur to those skilled in the art. It is, therefore, to be understood that the appended claims are intended to cover all such modifications and changes as fall within the scope and spirit of the exemplary embodiment.

What is claimed is:

1. A method of fabricating an array of multi-electroded piezoelectric transducers for use by a printhead having in-situ poling capabilities, comprising:
   carrying a piezoelectric configuration on a substrate used for high temperature annealing, the piezoelectric configuration, including
   (i) a plurality of piezoelectric islands formed in a two-dimensional array, each island including a first side and a second side, each of the first sides in contact with the substrate, and
   (ii) piezoelectric island interconnects which extend down lengths of each column of the piezoelectric islands;
   polishing the second side of the piezoelectric islands substantially flat;
   forming a bottom metal layer onto at least portions of the second sides of the piezoelectric islands and interconnects, the bottom metal layer having first areas corresponding to the piezoelectric islands and second areas corresponding to the piezoelectric interconnects;
   positioning a printhead metal actuation layer to receive the second sides of the piezoelectric islands and interconnects;
   bonding the metalized second side of the piezoelectric islands and interconnects to the printhead metal actuation layer;
   removing the substrate from the first side of the piezoelectric islands and interconnects;
   polishing the first side of the piezoelectric islands and interconnects;
   forming an upper metal layer onto at least portions of the first side of the piezoelectric islands and interconnects, wherein the upper metal layer includes first areas corresponding to the piezoelectric islands and second areas which are corresponding to the piezoelectric interconnects; and
   positioning the second areas of upper and bottom metal layers for connection to printhead electronics by printhead connectors.

2. The method of claim 1, wherein the printhead connectors have smaller widths than the piezoelectric interconnects.

3. The method of claim 1, wherein the piezoelectric is in a form of an annular ring being at least some distance from a center of a diaphragm.

4. The method of claim 1, wherein the poling voltages for in-situ poling are greater than about 300V.

5. The method of claim 1, wherein drop ejection voltages of the printhead are in the range of 10-100 volts.

6. The method of claim 1, wherein the poling time for in-situ poling is between approximately 1 minute and 30 minutes.

7. The method of claim 1, further including discs on the piezoelectric islands and connecting each disc in a column together by a first conductor.

8. The method of claim 1, further including locating annular rings on the piezoelectric islands and connecting each annular ring in a column together by a second conductor.

9. The method of claim 1, further including building the top electrode configuration to only be on a top surface of the piezoelectric.

10. The method of claim 1, wherein the piezoelectric is used as an insulator between the first and second conductors.

11. A method of fabricating an array of multi-electroded piezoelectric transducers comprising:
    carrying a piezoelectric configuration on a substrate, the piezoelectric configuration, including
    (i) a plurality of piezoelectric islands, each island including a first side and a second side, each of the first sides in contact with the substrate, and
    (ii) piezoelectric island interconnects which extend down lengths of each column of the piezoelectric islands;
    forming a bottom metal layer onto at least portions of the second sides of the piezoelectric islands and interconnects, the bottom metal layer having first areas corresponding to the piezoelectric islands and second areas corresponding to the piezoelectric interconnects;

positioning a metal actuation layer to receive the second sides of the piezoelectric islands and interconnects;

bonding the metalized second side of the piezoelectric islands and interconnects to the metal actuation layer;

removing the substrate from the first side of the piezoelectric islands and interconnects; and forming an upper metal layer onto at least portions of the first side of the piezoelectric islands and interconnects.

12. The method of claim 11, further including discs on the piezoelectric islands and connecting each disc in a column together by a first conductor.

13. The method of claim 11, further including locating annular rings on the piezoelectric islands and connecting each annular ring in a column together by a second conductor.

14. The method of claim 11, further including building the top electrode configuration to only be on a top surface of the piezoelectric.

15. The method of claim 11, wherein the piezoelectric is used as an insulator between the first and second conductors.

16. A method of fabricating an array of multi-electroded piezoelectric transducers for use by a printhead having in-situ poling capabilities, comprising:

carrying a piezoelectric configuration on a substrate used for high temperature annealing, the piezoelectric configuration, including (i) a plurality of piezoelectric islands formed in a two-dimensional array, each island including a first side and a second side, each of the first sides in contact with the substrate, and (ii) piezoelectric island interconnects which extend down lengths of each column of the piezoelectric islands;

forming a bottom metal layer onto at least portions of the second sides of the piezoelectric islands and interconnects, the bottom metal layer having first areas corresponding to the piezoelectric islands and second areas corresponding to the piezoelectric interconnects;

positioning a printhead metal actuation layer to receive the second sides of the piezoelectric islands and interconnects;

bonding the metalized second side of the piezoelectric islands and interconnects to the printhead metal actuation layer;

removing the substrate from the first side of the piezoelectric islands and interconnects;

forming an upper metal layer onto at least portions of the first side of the piezoelectric islands and interconnects, wherein the upper metal layer includes first areas corresponding to the piezoelectric islands and second areas which are corresponding to the piezoelectric interconnects; and positioning the second areas of upper and bottom metal layers for connection to printhead electronics by printhead connectors.

17. The method of claim 16, further including discs on the piezoelectric islands and connecting each disc in a column together by a first conductor.

18. The method of claim 16, further including locating annular rings on the piezoelectric islands and connecting each annular ring in a column together by a second conductor.

19. The method of claim 16, further including building the top electrode configuration to only be on a top surface of the piezoelectric.

20. The method of claim 16, wherein the piezoelectric is used as an insulator between the first and second conductors.

* * * * *